United States Patent
Kim et al.

(10) Patent No.: US 7,910,927 B2
(45) Date of Patent: *Mar. 22, 2011

(54) THIN FILM TRANSISTOR ARRAY PANEL WITH COMMON BARS OF DIFFERENT WIDTHS

(75) Inventors: Sang-Soo Kim, Seoul (KR); Dong-Gyu Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/715,319

(22) Filed: Mar. 1, 2010

(65) Prior Publication Data

US 2010/0148180 A1 Jun. 17, 2010

Related U.S. Application Data

(63) Continuation of application No. 10/522,848, filed as application No. PCT/KR02/01763 on Sep. 18, 2002, now Pat. No. 7,700,948.

(30) Foreign Application Priority Data

Aug. 1, 2002 (KR) .................. 10-2002-0045563

(51) Int. Cl.
*H01L 29/04* (2006.01)
*H01L 31/036* (2006.01)
*H01L 31/0376* (2006.01)
*H01L 31/20* (2006.01)

(52) U.S. Cl. .................. 257/59; 257/E21.703
(58) Field of Classification Search .................. 257/59, 257/E21.703
See application file for complete search history.

(56) References Cited

U.S. PATENT DOCUMENTS

| 5,668,032 A | 9/1997 | Holmberg et al. |
| 6,621,537 B1 | 9/2003 | Nakamura et al. |
| 6,861,665 B2 | 3/2005 | Kim |
| 7,700,948 B2 * | 4/2010 | Kim et al. .................. 257/59 |

FOREIGN PATENT DOCUMENTS

| CN | 1172962 A | 2/1998 |
| JP | 03-072321 | 3/1991 |
| JP | 7-64508 | 3/1995 |
| JP | 2000-111937 | 4/2000 |
| JP | 2001-005038 | 1/2001 |
| JP | 2001-194688 | 7/2001 |
| KR | 1999-0059580 | 7/1999 |
| KR | 2000-0022726 | 4/2000 |
| KR | 2001-0050708 | 6/2001 |
| KR | 1020010050708 A | 6/2001 |
| KR | 2001-0086613 | 9/2001 |
| KR | 2001-0098084 | 11/2001 |
| KR | 100552280 B | 2/2006 |

* cited by examiner

*Primary Examiner* — Howard Weiss
(74) *Attorney, Agent, or Firm* — Innovation Counsel LLP

(57) ABSTRACT

A gate wire and a storage electrode wire extending in a transverse direction are provided, and a data wire extending in a longitudinal direction intersects the gate wire and the storage electrode wire. A plurality of pixel electrodes and a plurality of TFTs are provided on pixel areas defined by the intersections of the data wire and the gate wire. The storage electrode wire is interconnected by a plurality of storage electrodes connections provided on the pixel areas. In this way, a common bar disposed between gate pads and a display area is omitted or has reduced width. Therefore, the fan-out areas becomes to have sufficient size to reduce the resistance difference between the signal lines.

12 Claims, 27 Drawing Sheets

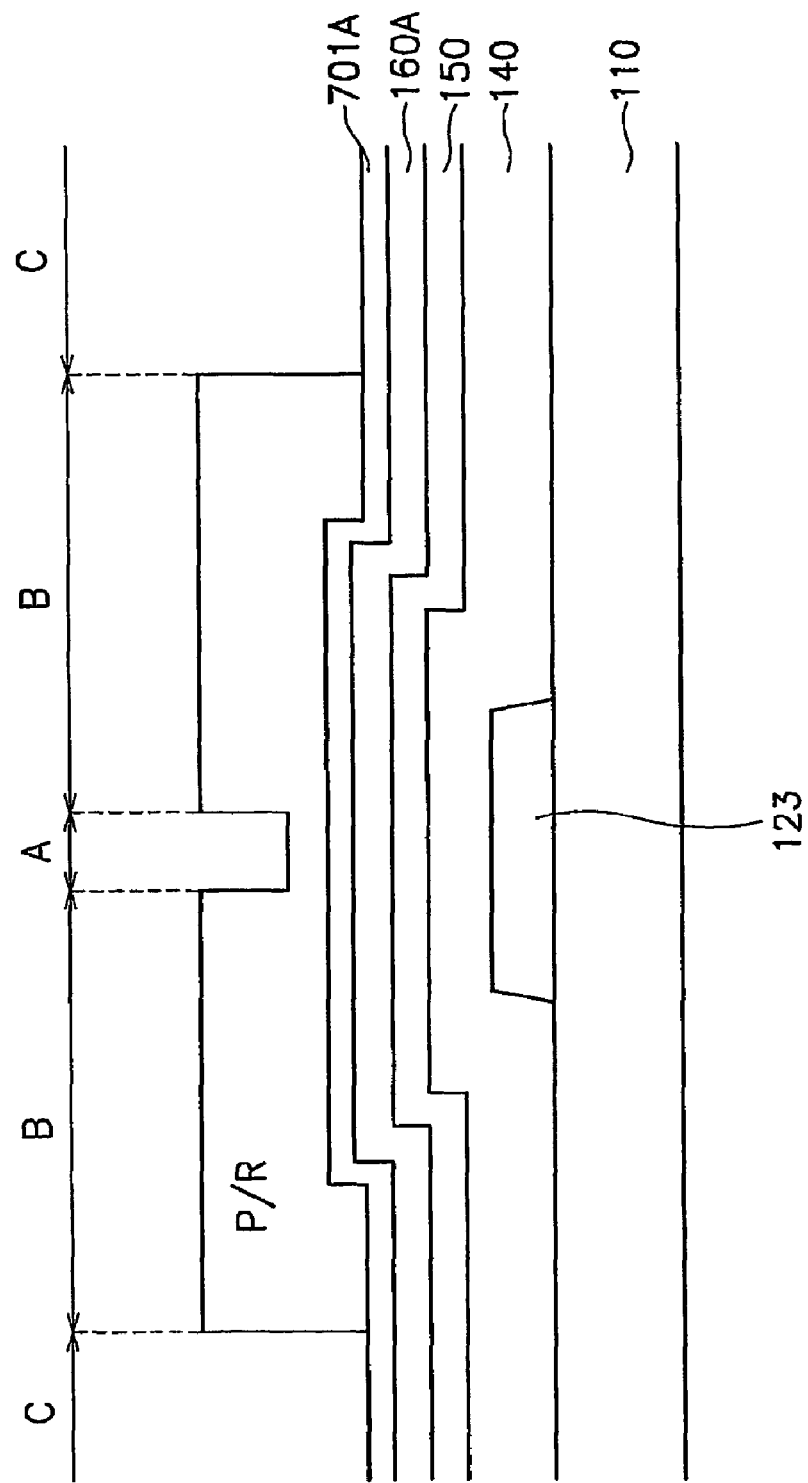

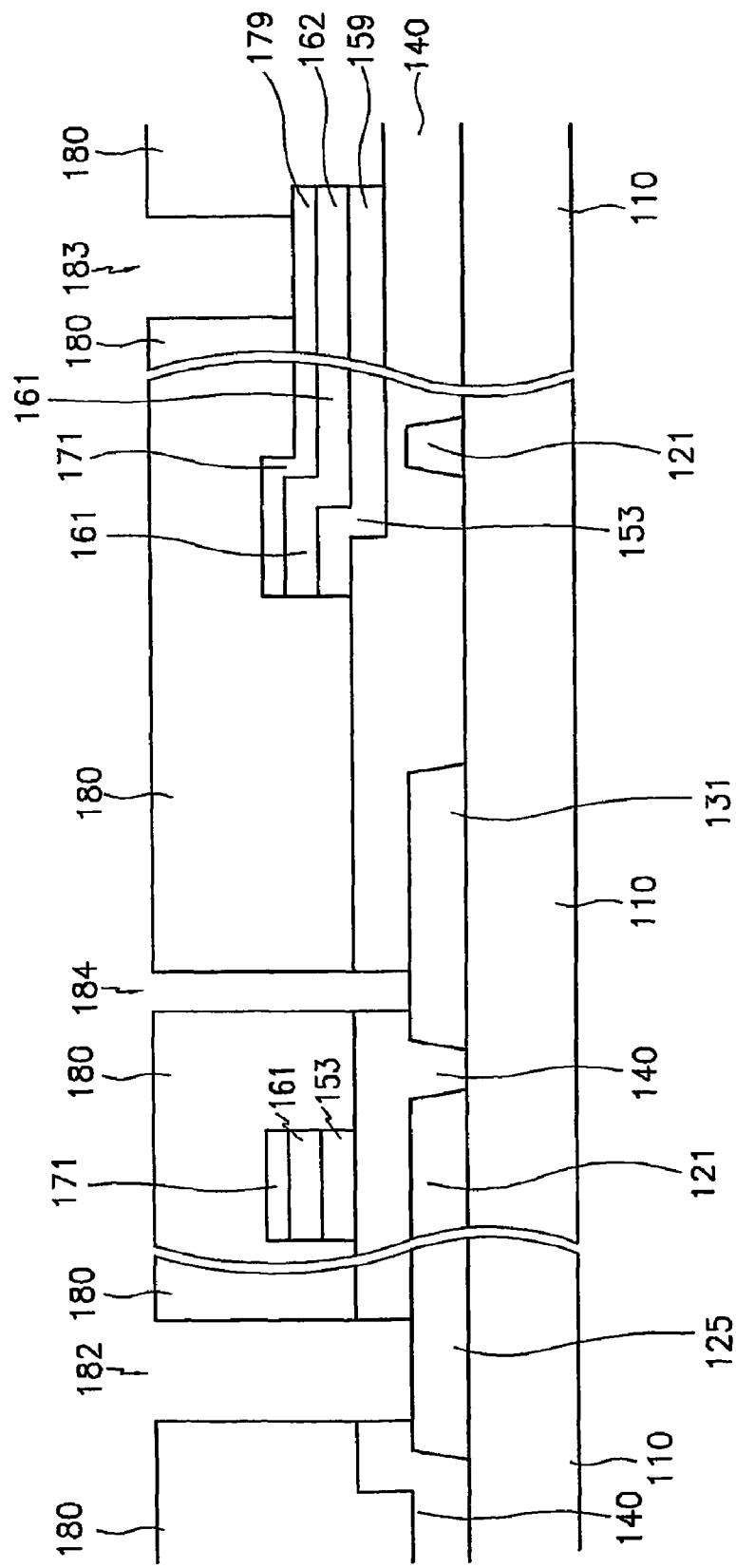

THIN FILM TRANSISTOR ARRAY PANEL WITH COMMON BARS OF DIFFERENT WIDTHS

CROSS-REFERENCE TO RELATED APPLICATIONS

This application is a continuation of U.S. patent application Ser. No. 10/522,848, filed on Sep. 20, 2005, now U.S. Pat. No. 7,700,948, which application claims the benefit of PCT/KR2002/001763, filed on Sep. 18, 2002, which in turn claims the benefit of Korean Patent Application No. 2002/45563, filed on Aug. 1, 2002, all of which are incorporated by reference herein.

BACKGROUND OF THE INVENTION

A Field of the Invention

The present invention relates to a thin film transistor array panel, and in particular, a thin film transistor array panel including a fan-out area provided with connections for connecting a wire and a pad between a display area and the pad area.

B Description of Related Art

A thin film transistor (TFT) array panel is used as a circuit panel for independently driving pixels of a display device such as an LCD and an organic electroluminescence (EL) display device. The TFT array panel includes a scanning signal wire or a gate wire transmitting scanning signals and an image wire a data wire transmitting data signals, a plurality of TFTs connected to the gate wire and the data wire, a plurality of pixel electrodes connected to the TFTs, the gate insulating layer covering and insulating the gate wire, and a passivation layer covering and insulating the TFTs and the data wire. The TFTs include the gate electrodes, which are portions of the gate wire, a semiconductor layer forming channels, the source electrodes and the drain electrodes, which are portions of the data wire, the gate insulating layer, the passivation layer, and so on. The TFTs are switching elements for transmitting and blocking the data signals to be supplied to the pixel electrodes from the data wire in response to the scanning signals from the gate wire.

A plurality of driving ICs for applying driving signals to gate lines and data lines are connected to the TFT array panel. The driving ICs are connected to the gate lines and the data lines through a plurality of pads, and the pads are gathered in narrow areas for connection to the driving ICs. On the contrary, the distances between the gate lines or the data lines on a display area, which are determined by the size of pixels, are larger than the distances between the pads. Accordingly, there are a plurality of areas between pad areas and the display area, where the distances of the signal lines increases, and the areas are called fan-out areas. The existence of the fan-out areas results in the difference in the length between the signal lines, and thus the difference in the RC delay between the signal lines. The difference of the RC delay differentiates images to deteriorate image quality.

The fan-out area occupies a narrow area and is located between the display area provided with a plurality of pixels and edges of the panels. When a common bar connecting a plurality of storage electrode lines and applying a common voltage to the storage electrode lines are disposed between the display area and the pad areas, the common bar occupies a portion of the areas to be assigned to the fan-out areas. As the fan-out areas are narrower, the curved angles of the signal lines in the fan-out areas are larger to increase the difference in the length between the signals lines and the width of the signal lines is smaller. Accordingly, the difference in the resistance between the signal lines on the fan-out areas is amplified.

This problem is much severe for a COG (chip on glass) type LCD. The pitch, i.e., the distance between output pins of a COG chip is about 45 microns, which is very small compared with the pitch of 100 microns between output pads in TAB (tape automatic bonding) type. Therefore, the curved angles of the signal may be much increased.

SUMMARY OF THE INVENTION

A motivation of the present invention is to reduce the difference in RC delay between signal lines in a TFT array panel.

Based on the motivation, a storage electrode wire is interconnected by signal paths provided on pixel areas.

In detail, a thin film transistor array panel is provided, which includes: an insulating substrate; a gate wire formed on the insulating substrate and including a plurality of gate lines, a plurality of gate electrodes, and a plurality of gate pads connected to one ends of the gate lines; a storage electrode wire formed on the insulating substrate and including a plurality of storage electrode lines and a plurality of storage electrodes; a gate insulating layer formed on the gate wire and the storage electrode wire; a semiconductor layer formed on the gate insulating layer; a data wire formed on the gate insulating layer and including a plurality of data lines insulated from and crossing over the gate lines, a plurality of source electrodes contacting the semiconductor layer in part, a plurality of drain electrodes facing the source electrodes and contacting the semiconductor layer in part, and a plurality of data pads connected to one ends of the data lines; a passivation layer formed on the data wire; a plurality of pixel electrodes formed on the passivation layer and electrically connected to the drain electrodes; and a plurality of storage electrode connections formed on the passivation layer and connecting the storage electrode lines and the storage electrodes facing across the gate lines.

Alternatively, a thin film transistor array panel is provided, which includes: an insulating substrate; a gate wire formed on the insulating substrate and including a plurality of gate lines, a plurality of gate electrodes, and a plurality of gate pads connected to one ends of the gate lines; a storage electrode wire formed on the insulating substrate and including a plurality of storage electrode lines and a plurality of storage electrodes; a gate insulating layer formed on the gate wire; a semiconductor layer formed on the gate insulating layer; a data wire formed on the gate insulating layer and having a triple-layered structure including an amorphous silicon layer, an ohmic contact layer, and a metal layer, the data wire including a plurality of data lines, a plurality of source electrodes connected to the data lines, a plurality of drain electrodes facing the source electrodes, and a plurality of data pads; a passivation layer formed on the data wire; a plurality of pixel electrodes formed on the passivation layer and electrically connected to the drain electrodes; and a plurality of storage electrode connections formed on the passivation layer and connecting the storage electrode lines and the storage electrodes facing across the gate lines.

The thin film transistor array panel may further include a plurality of color filters disposed between the data wire and the passivation layer, and may further include a common bar connected to one ends of all the storage electrode lines.

Alternatively, a thin film transistor array panel is provided, which includes: an insulating substrate; a first signal line formed on the insulating substrate and extending in a transverse direction; a second signal line formed on the insulating substrate and extending in a transverse direction; a third signal line insulated from and crossing over the first and second and extending in a longitudinal direction; a plurality of pixel electrodes in pixel areas defined by intersections of the first signal lines and the third signal lines; and a plurality of thin film transistors connected to the first signal lines, the third signal lines, and the pixel electrodes, wherein the second signal lines are connected to each other via connecting paths provided on the pixel areas.

The thin film transistor array panel may further include a common bar connecting one ends of the second signal lines.

Alternatively, a thin film transistor array panel is provided, which includes: an insulating substrate; a plurality of first signal lines formed on the insulating substrate, extending in a transverse direction, and including a plurality of first signal pads; a plurality of second signal lines formed on the insulating substrate and extending in a transverse direction; a plurality of third signal lines insulated from and intersecting the first and the second signal lines, extending in a longitudinal direction, and including a plurality of third signal pads; a plurality of pixel electrodes provided on pixel areas defined by intersections of the first signal lines and the third signal lines; a plurality of signal lines connected to the first signal lines, the third signal lines, and the pixel electrodes; a first common bar connecting ends of the second signal lines located opposite the first signal pads; and a second common bar connecting ends of the second signal lines located near the first signal pads, wherein the second the common bar has a width equal to or less than 150 microns.

Figure 1:
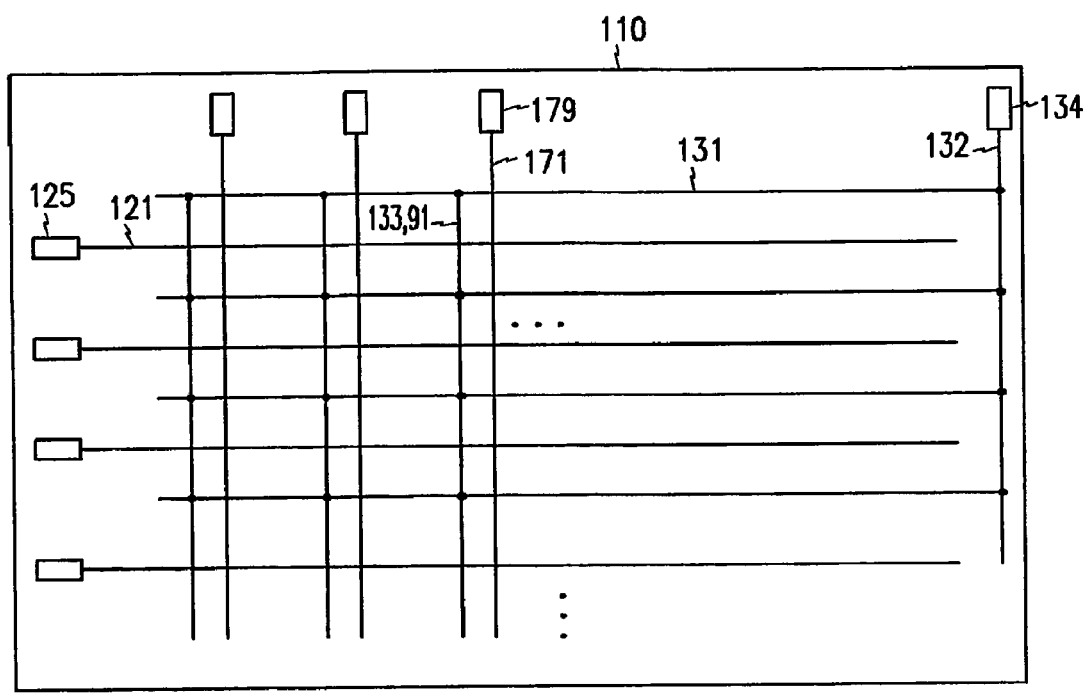
FIG. 1 is a schematic diagram of a TFT array panel according to a first embodiment of the present invention.

| *DESCRIPTION OF REFERENCE NUMERALS IN THE DRAWINGS* | |
|---|---|
| 95: | subsidiary gate pad |
| 97: | subsidiary data pad |
| 110: | insulating substrate |
| 121: | gate Line |
| 123: | gate electrode |
| 125: | gate pad |
| 131: | storage electrode line |
| 140: | gate insulating layer |
| 151, 153, 157, 159: | semiconductor layer |
| 161, 162, 163, 165, 169: | ohmic contact layer |
| 171: | data line |
| 173: | source electrode |
| 175: | drain electrode |
| 179: | data pad |
| 190: | pixel electrode |

DETAILED DESCRIPTION OF PREFERRED EMBODIMENTS

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described in detail with reference to accompanying drawings.

FIG. 1 is a schematic diagram of a TFT array panel according to a first embodiment of the present invention.

A plurality of gate lines 121 extending in a transverse direction and a plurality of data lines 171 insulated from and crossing over the gate lines 121 and extending in a longitudinal direction are formed on an insulating substrate 110. A plurality of gate pads 125 and a plurality of data pads 179 are provided at right ends of the gate lines 121 and upper ends of the data lines 171, respectively. A plurality of pad areas (not shown) are provided between the gate pads 125 and a display area (where the gate lines 121 and the data lines 171 intersect). A storage electrode line 131 extending in the transverse direction is formed between every adjacent two of the gate lines 121, and all the storage electrode lines 131 on the substrate 110 are connected to each other through a plurality of storage electrodes 133 and a plurality of storage electrode connections 91. The storage electrode lines 131 are also connected to each other through the right-handed common bar 132. The common bar 132 includes a pad 134 at its end.

Since the storage electrode lines 131 are connected to each other via the storage electrodes 133 and the storage electrode connections 91, there is no common bar between the gate pads 125 and the display area. Accordingly, the size of the fan-out areas are sufficiently secured such that the cured angles of the gate lines 121 on the fan-out areas are reduced and the difference in the resistance between the gate lines 121 are also reduced.

TABLE 1 illustrates the difference in resistance in fan-out areas between the signal lines in an LCD according to an embodiment of the present invention and in an LCD having a conventional common bar. The measurement was performed for a 15" XGA LCD panel mounting three equidistant COG IC (integrated circuit) chips, each having 250 channels and a pitch of 45 microns.

TABLE 1

|  |  | fan-out length | width | sheet length | sheet resistance | resistance (ohm) | resistance difference (ohm) |
| --- | --- | --- | --- | --- | --- | --- | --- |
| with common bar | longest signal line | 30,175 | 10 | 3017.5 | 0.2 | 603.5 | 603.5 − 41.7 = 561.8 |
|  | shortest signal line | 2,087 | 10 | 208.7 | 0.2 | 41.7 |  |
| present invention | longest signal line | 32,175 | 15 | 2145 | 0.2 | 429 | 429 − 345 = 394.5 |
|  | shortest signal line | 2,587 | 15 | 1725 | 0.2 | 345 |  |

It can be known form TABLE 1 that the resistance difference between the longest signal line and the shortest signal line of an LCD according to an embodiment of the present invention is much reduced compared with that of a conventional LCD.

Second to fifth embodiments illustrate detailed configurations for connecting the storage electrode lines 131 using the storage electrodes 133 and the storage electrode connections 91 as shown in FIG. 1.

Figure 2:
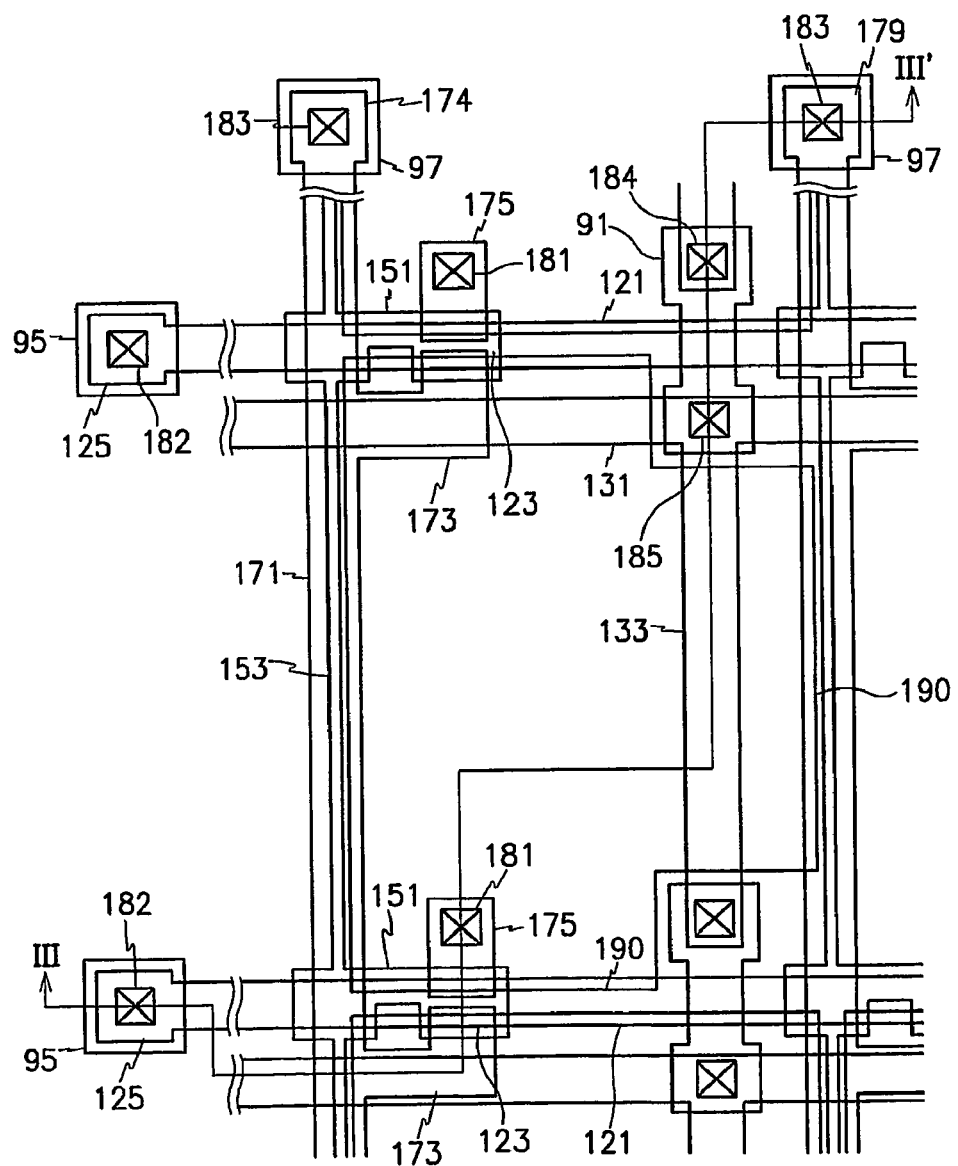
FIG. 2 is a layout vies of a TFT array panel according to a second embodiment of the present invention.
Figure 3:
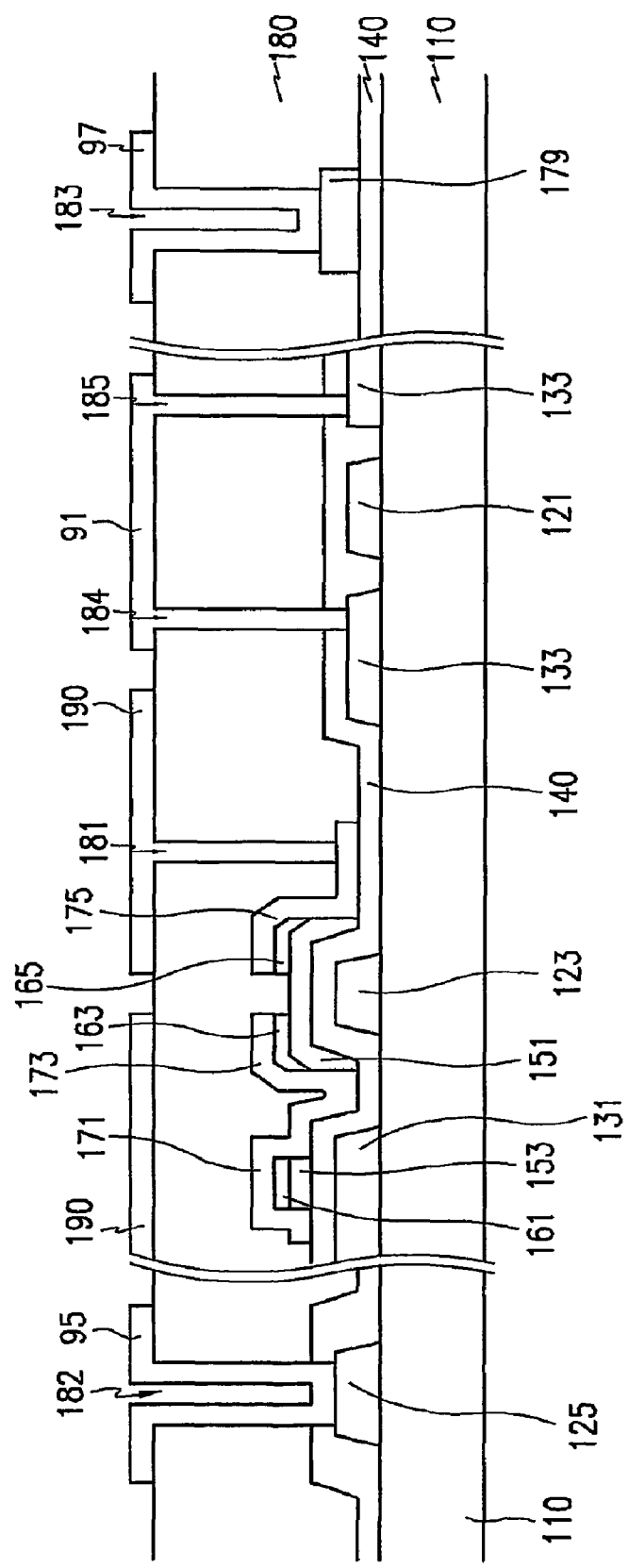
FIG. 3 is a sectional view of the TFT array panel shown in FIG. 2 taken along the line III-III'.

FIG. 2 is a layout vies of a TFT array panel according to a second embodiment of the present invention, and FIG. 3 is a sectional view of the array panel shown in FIG. 2 taken along the line III-III'.

A gate wire 121, 123 and 125 and the storage electrode wire 131 and 133 are formed on an insulating substrate 110.

The gate wire 121, 123 and 125 includes the gate lines 121 extending in a transverse direction, a plurality of the gate electrodes 123, which are parts of the gate lines 121, and a plurality of gate pad connected to one ends of the gate lines 121, receiving gate signals from an external device to be transmitted to the gate lines 121. The gate wire 121, 123 and 125 is tapered such that the top of the gate wire is narrower than the bottom of the gate wire, and this structure improves the step coverage between the gate wire 121, 123 and 125 and overlying layers.

The storage electrode wire includes a plurality of storage electrode lines 131 extending in the transverse direction and a plurality of the storage electrodes 133 connected to the storage electrode lines 131 and extending in a longitudinal direction. The storage electrode wire 131 and 133 is also tapered.

A gate insulating layer 140 is formed on the gate wire 121, 123 and 125 and the storage electrode wire 131 and 133.

An amorphous silicon layer 151 and 153 and an ohmic contact layer 161, 163 and 165 preferably made of semiconductor such as amorphous silicon heavily doped with n type impurity are formed on predetermined areas of the gate insulating layer 140.

A data wire 171, 173, 175 and 179 made of tungsten is formed on the ohmic contact layer 161, 163 and 165 and the gate insulating layer 140. The data wire 171, 173, 175 and 179 includes a plurality of data lines 171 intersecting the gate lines 121 to define a plurality of pixel areas, the source electrodes 173 branched from the data lines 171 and connected to the ohmic contact layer 163, a plurality of drain electrodes 175 separated from the source electrodes 173 and opposite the source electrodes 173 with respect to the gate electrodes 123, and a plurality of the data pads 179 connected to one ends of the data lines 171 to be connected to an external circuit.

A passivation layer 185 is formed on the data wire 171, 173, 175 and 179. The passivation layer has a plurality of first contact holes 181 exposing the drain electrodes 175, a plurality of second contact holes 182 exposing the gate pads 125, a plurality of third contact holes 183 exposing the data pads 179, a plurality of fourth contact holes 184 exposing end portions of the storage electrodes 133, and a plurality of fifth contact holes 185 exposing the storage electrode lines 131.

A plurality of pixel electrodes 190 connected to the drain electrodes 175 through the first contact holes 181, the subsidiary gate pads 95 connected to the gate pads 125 through the second contact holes 182, and the subsidiary data pads 97 connected to the data pads 179 through the third contact holes 183 are formed on the passivation layer 180. A plurality of storage electrode connections 91 connected to the storage electrodes 133 and the storage electrode lines 131 through the fourth and the fifth contact holes 184 and 185 are formed. The storage electrode connections 91 connects the storage electrodes 133 to the storage electrode lines 131 opposite the gate lines 121 across the gate lines 121. Accordingly, all the storage electrode wire 131 and 133 on the substrate 110 are connected to each other via connection paths provided at all the pixel areas. In this way, the storage electrode wire 131 and 133 is interconnected via several paths such that its resistance is kept to be low at any point in the substrate 110.

Figure 4:
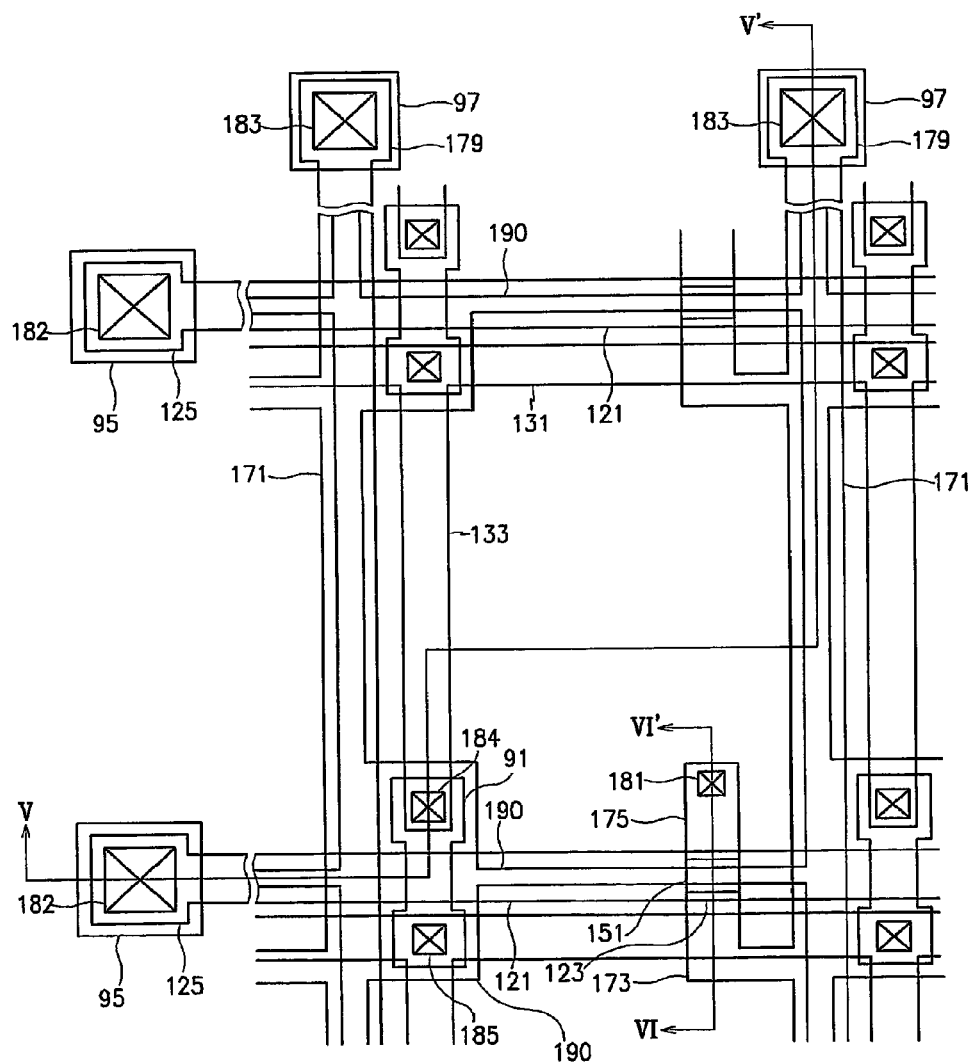
FIG. 4 is a layout view of a according to a third embodiment of the present invention.
Figure 5:
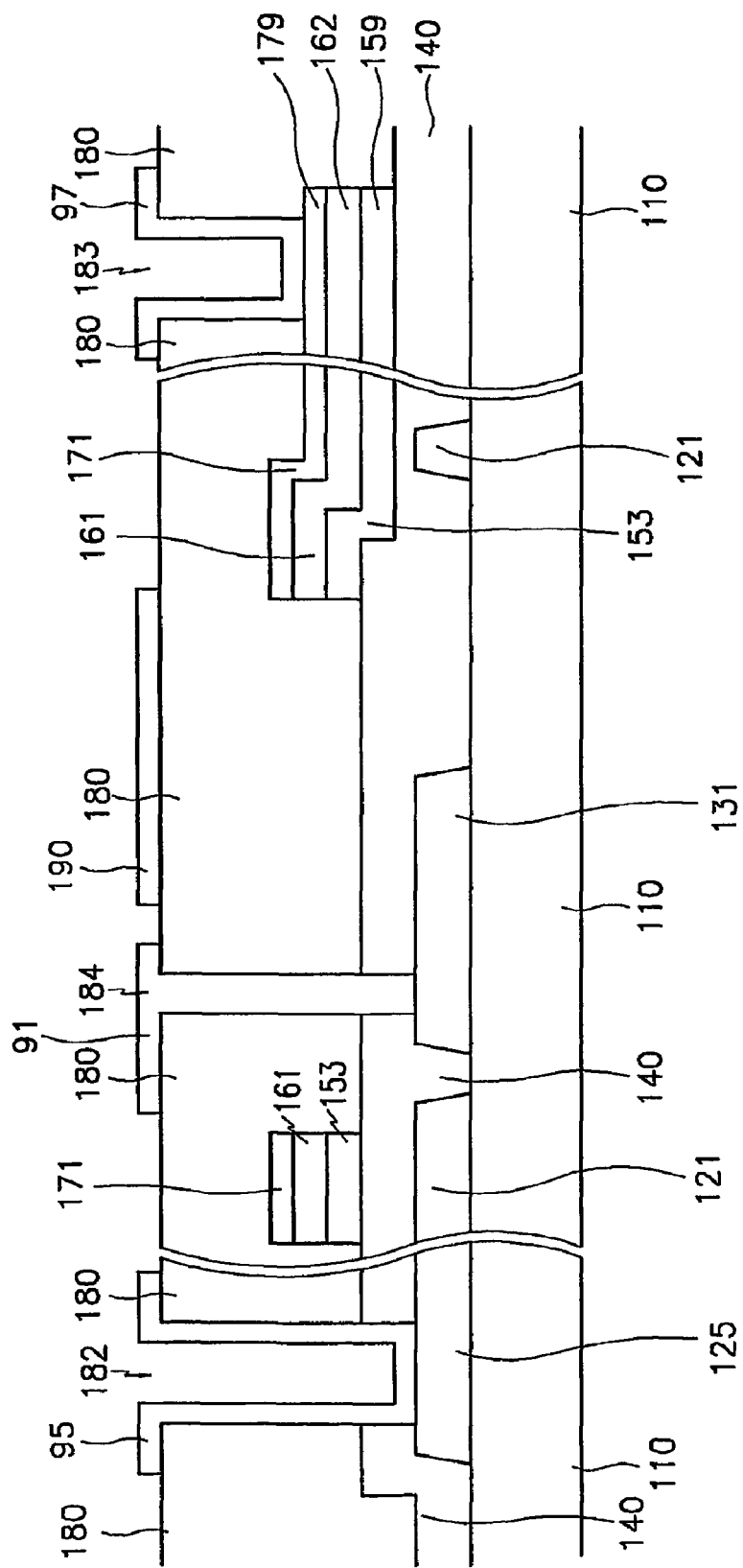
FIG. 5 is a sectional view of the TFT array panel shown in FIG. 4 taken along the line V-V'.
Figure 6:
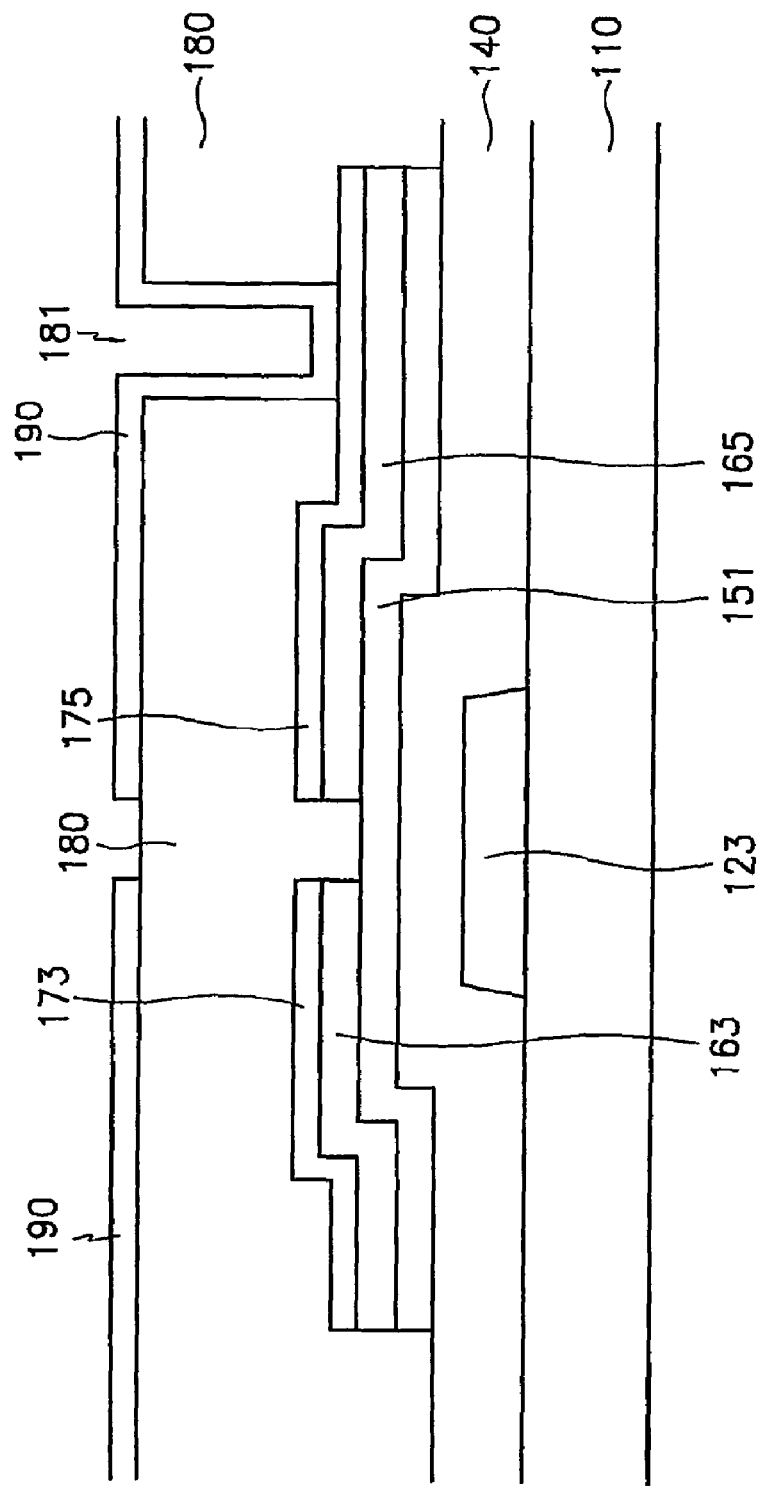
FIG. 6 is a sectional view of the TFT array panel shown in FIG. 4 taken along the line VI-VI'.

FIG. 4 is a layout view of a according to a third embodiment of the present invention, and FIGS. 5 and 6 are sectional views of the TFT array panel shown in FIG. 4 taken along the lines V-V' and VI-VI', respectively.

Referring to FIGS. 4-6, a gate wire 121, 123 and 125 and a storage electrode wire 131 and 133 are formed on a transparent insulating substrate 110. The gate wire 121, 123 and 125 and the storage electrode wire 131 and 133 is preferably made of Al or Ag and are tapered to have smoothly inclined lateral sides. Therefore, layers on the gate wire 121, 123 and 125 and the storage electrode wire 131 and 133 are protected from being disconnected or damaged due the step difference of the gate wire 121, 123 and 125 and the storage electrode wire 131 and 133.

The gate wire 121, 123 and 125 includes a plurality of gate lines 121, a plurality of gate pads 125, and a plurality of gate electrodes 123. The storage electrode wire 131 and 133 includes a plurality of storage electrode lines 131 and a plurality of storage electrodes 133. The storage electrode lines 131 overlap pixel electrodes to form storage capacitors for enhancing charge storing capacity of pixels, which will be described later. The storage electrode wire 131 and 133 may be omitted if the storage capacitance generated by the overlap of the pixel electrodes and the gate lines is sufficient.

A gate insulating layer 140 is formed on the gate wire 121, 123 and 125 and the storage electrode wire 131 and 133, and an amorphous silicon layer 151, 153 and 159 and an ohmic contact layer 161, 162, 163 and 165 are formed on predetermined areas of the gate insulating layer 140.

A data wire 171, 173, 175 and 179 preferably made of Al or Ag is formed on the ohmic contact layer 161, 162, 163 and 165. The data wire 171, 173, 175 and 179 includes a plurality of data lines 171, a plurality of data pads 179, a plurality of source electrodes 173, a plurality of drain electrodes 175, and a plurality of data pads 179.

The data wire 171, 173, 175 and 179 and the ohmic contact layer 161, 162, 163 and 165 have substantially the same shape, and the amorphous silicon layer 151, 153 and 159 except for channel portions 151 of the TFTs has substantially the same shape as the data wire 171, 173, 175 and 179 and the ohmic contact layer 161, 162, 163 and 165. In detail, the source electrodes 173 and the drain electrodes 175 and the ohmic contact layer 163 and 165 thereunder are separated from each other, the source electrodes 173 and the drain electrodes 175, but the amorphous silicon layer 151 is not divided and continues to form channels of the TFTs.

The passivation layer 180 including a plurality of first to fifth contact holes 181-185 is formed on the data wire 171, 173, 175 and 179. The first contact holes 181 expose the chain electrodes 175, the second contact holes 182 expose the gate pads 125, the third contact holes 183 expose the data pads 179, and the fourth and the fifth contact holes 184 and 185 expose the storage electrodes 133 and the storage electrode lines 131, respectively.

A plurality of pixel electrodes 190 connected to the drain electrodes 175 through the first contact holes 181, the subsidiary gate pads 95 connected to the gate pads 125 through the second contact holes 182, and the subsidiary data pads 97 connected to the data pads 179 through the third contact holes 183 are formed on the passivation layer 180. A plurality of storage electrode connections 91 connected to the storage electrodes 133 and the storage electrode lines 131 through the fourth and the fifth contact holes 184 and 185 are formed. The storage electrode connections 91 connects the storage electrodes 133 to the storage electrode lines 131 opposite the gate lines 121 across the gate lines 121. Accordingly, all the storage electrode wire 131 and 133 on the substrate 110 are connected to each other via connection paths provided at all the pixel areas. In this way, the storage electrode wire 131 and 133 are connected via several paths such that its resistance is kept to be low at any point in the substrate 110.

A manufacturing method of a TFT array panels having an above-described structure is described in detail with reference to FIGS. 7A to 12C.

Figure 7A:
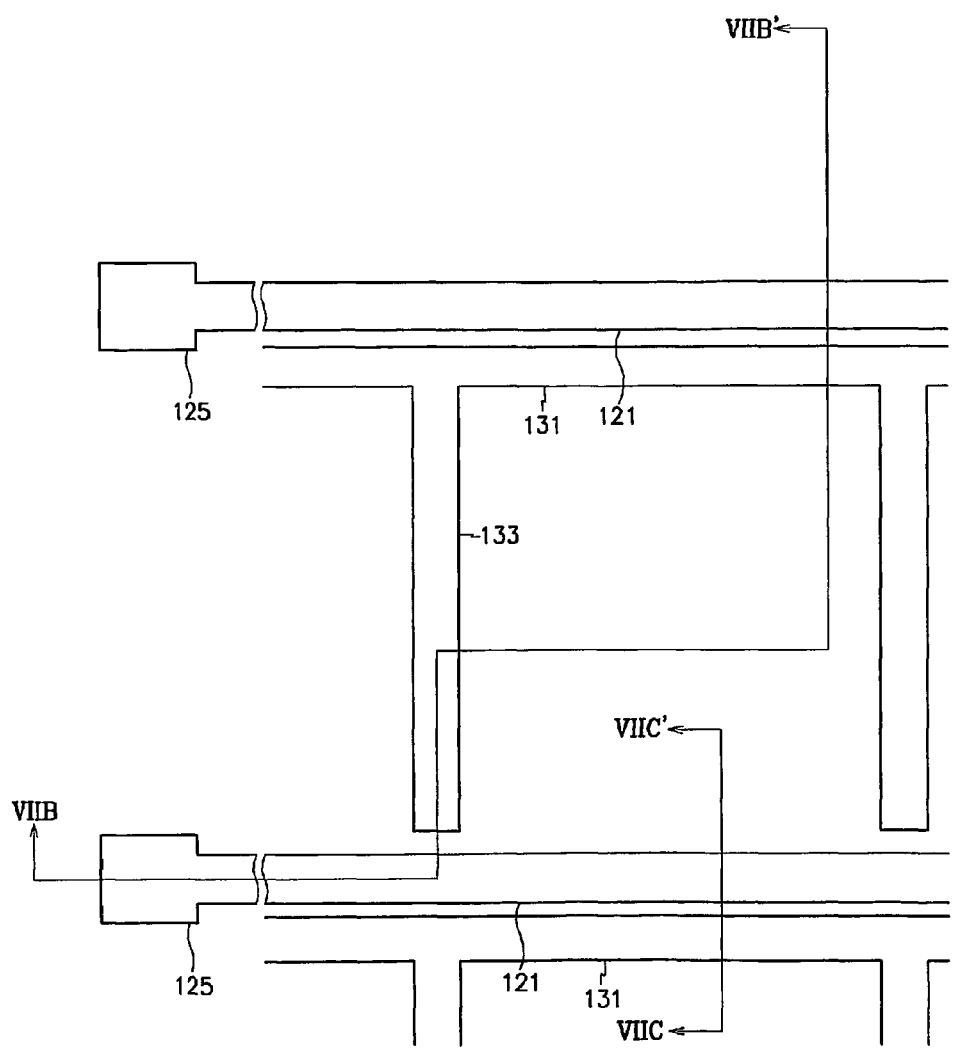
FIGS. 7A to 12C are layout view and sectional views of a TFT array panel illustrating in process steps of a manufacturing method thereof according to a third embodiment of the present invention.
Figure 7B:
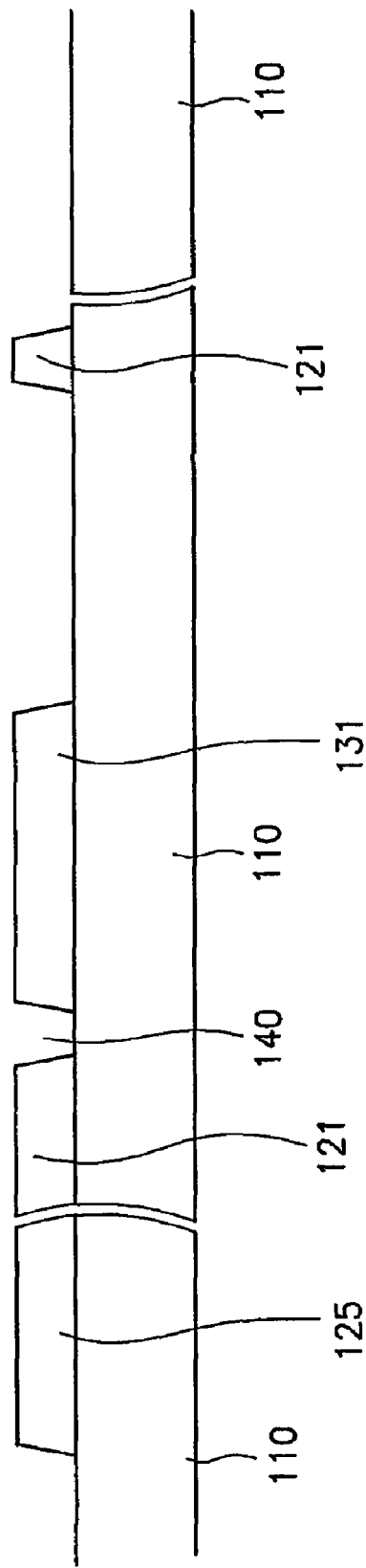
Figure 7C:
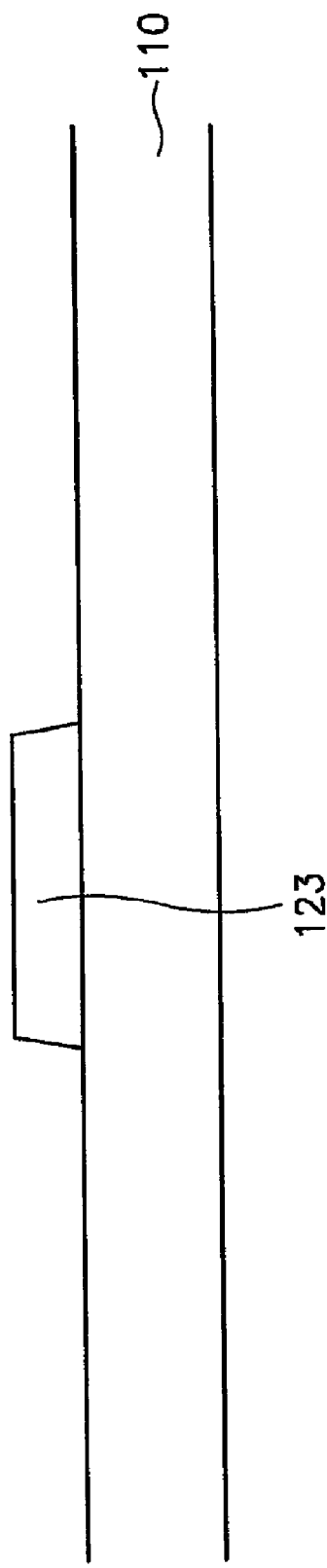

Referring to FIGS. 7A to 7C, a metal such as Al and Ag is deposited on a transparent insulating substrate 110 and patterned to form a gate wire 121, 123 and 125 and a storage electrode wire 131 and 133.

The gate wire 121, 123 and 125 and the storage electrode wire 131 and 133 may have a double-layered structure.

Figure 8A:
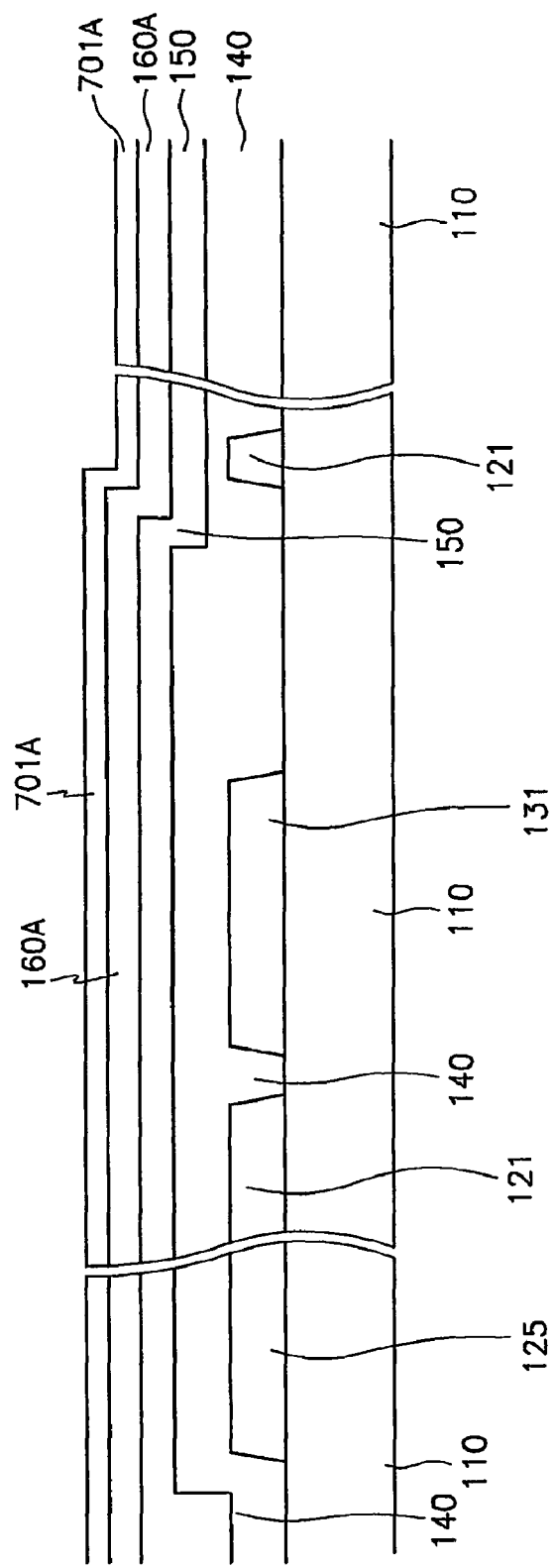
Figure 8B:
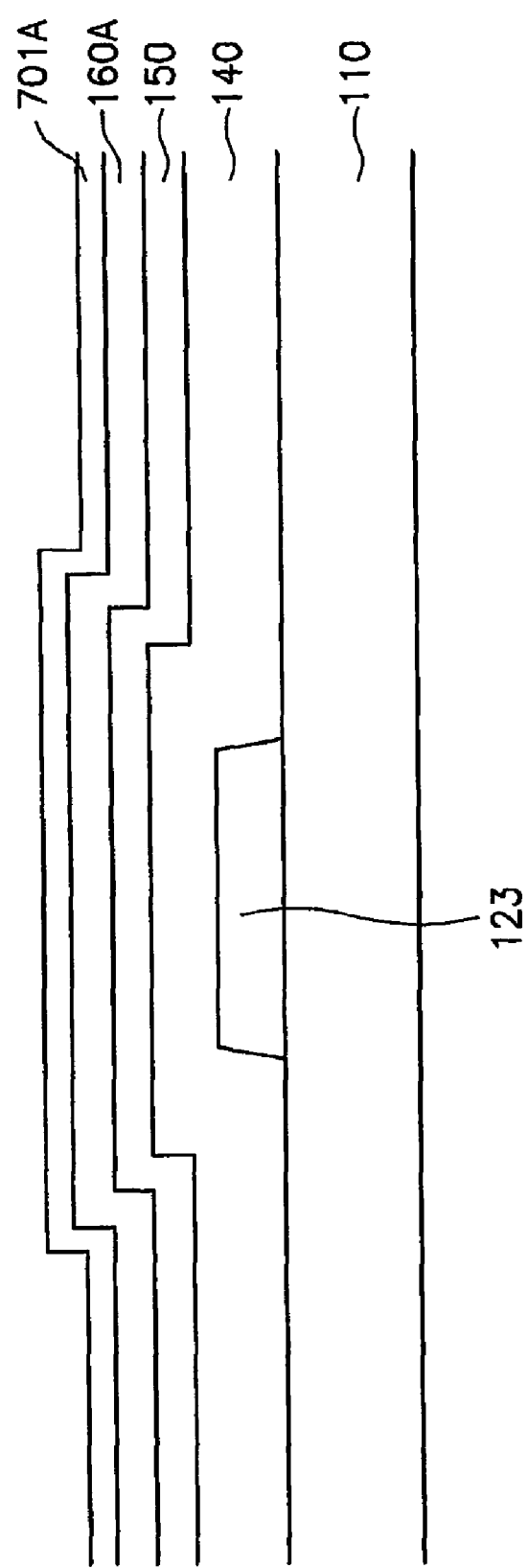

Referring to FIGS. 8A to 8B, a gate insulating layer 140 preferably made of silicon nitride, an intrinsic amorphous silicon layer 150, an extrinsic amorphous silicon layer 160A are formed on the gate wire 121, 123 and 125 and the storage electrode wire 131 and 133 by chemical vapor deposition (CVD). A metal layer 701A preferably made of Al or Ag is deposited on the extrinsic amorphous silicon layer 160A.

Figure 9A:
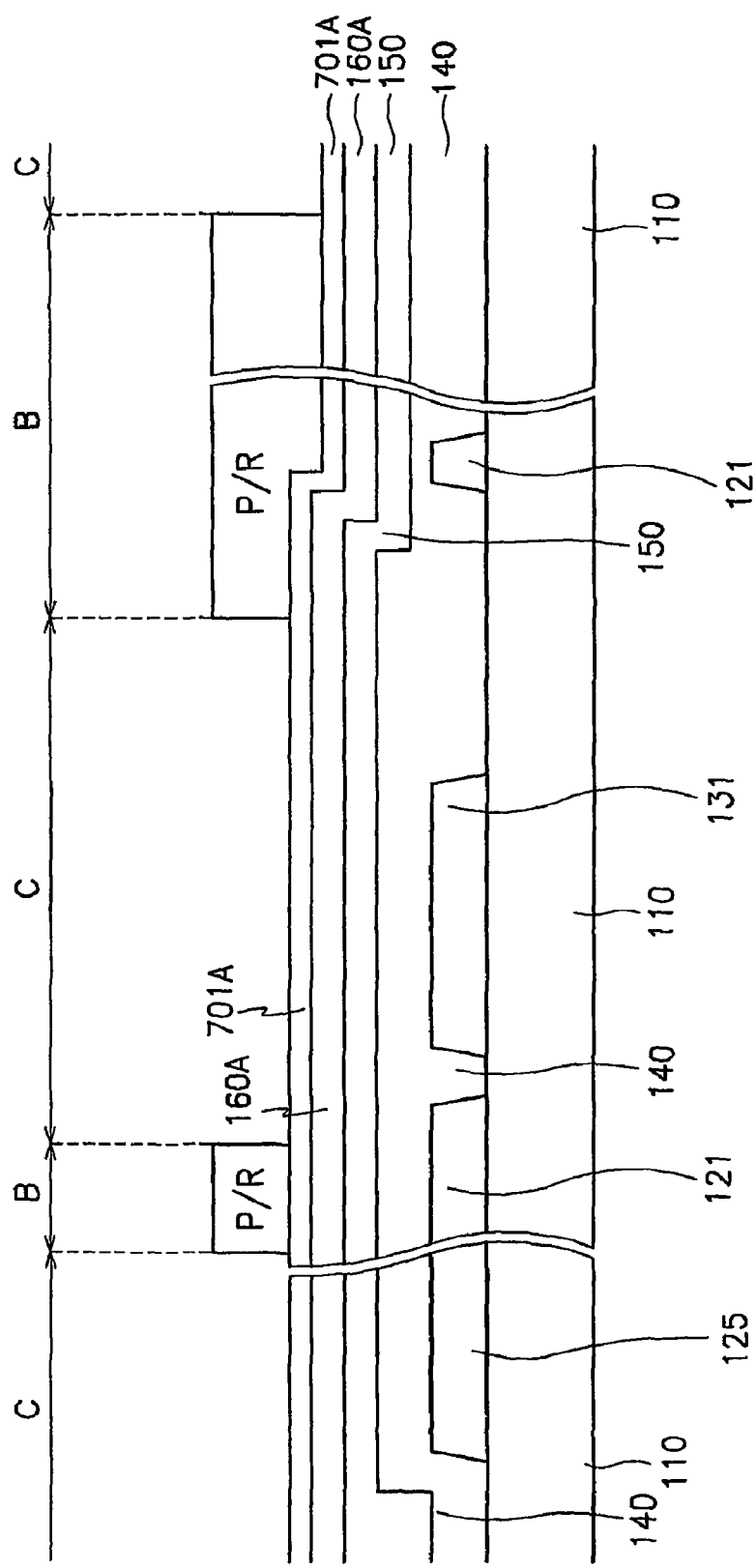

Referring to FIGS. 9A and 9B, a photoresist film P/R is coated on the metal layer 701A, exposed to light, and developed to form a the photoresist pattern P/R. A plurality of first portions of the photoresist pattern P/R on first areas A, which are located on channels of TFTs in the amorphous silicon layer 151, have thickness thinner than a plurality of second portions located on second areas B for a data wire 160A, and portions of the photoresist film on the remaining areas are removed to expose portions of the metal layer 701A.

The position-dependent thickness of the photoresist pattern is obtained by using slit patterns, lattice patterns, or translucent layers, which may be selected by the necessity. The detailed description of these techniques is well known to ordinary skill in the art and thus omitted.

Figure 10A:
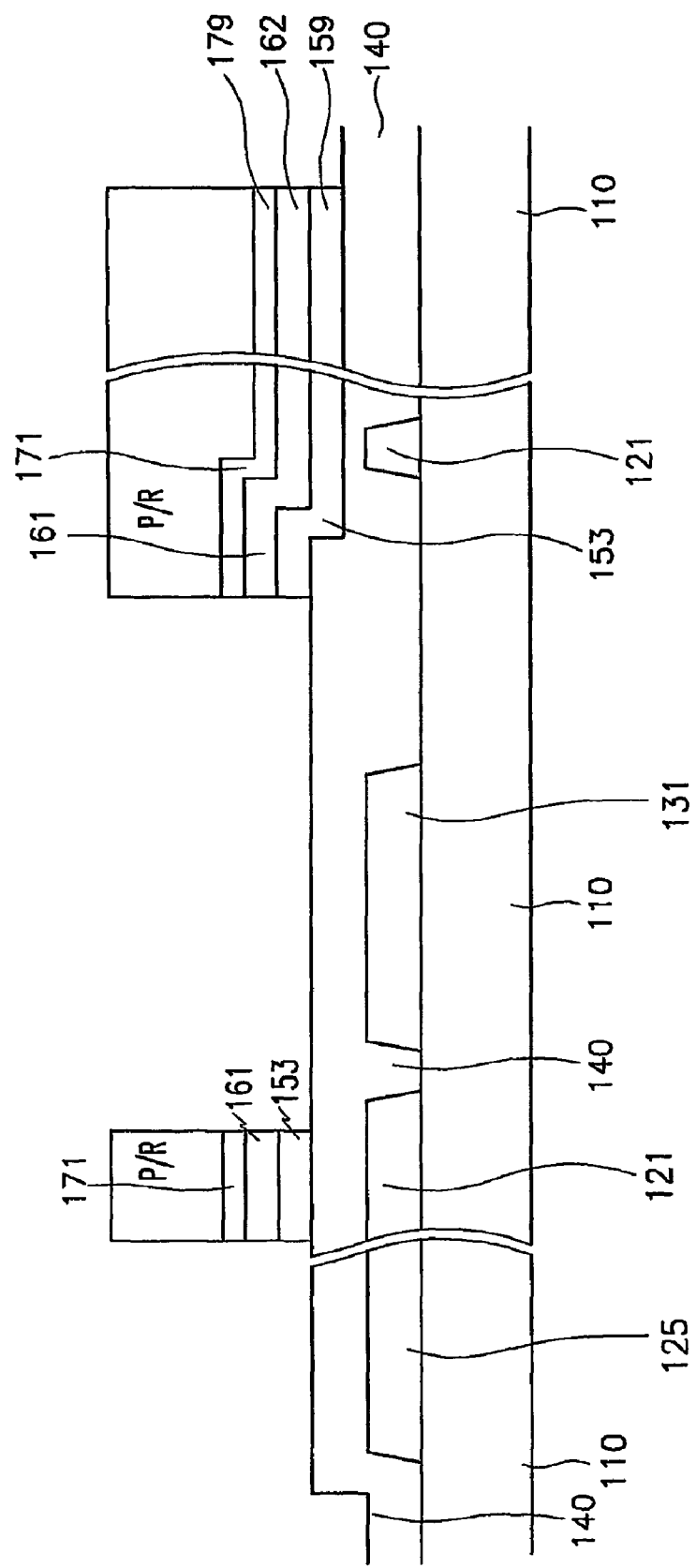
Figure 10B:
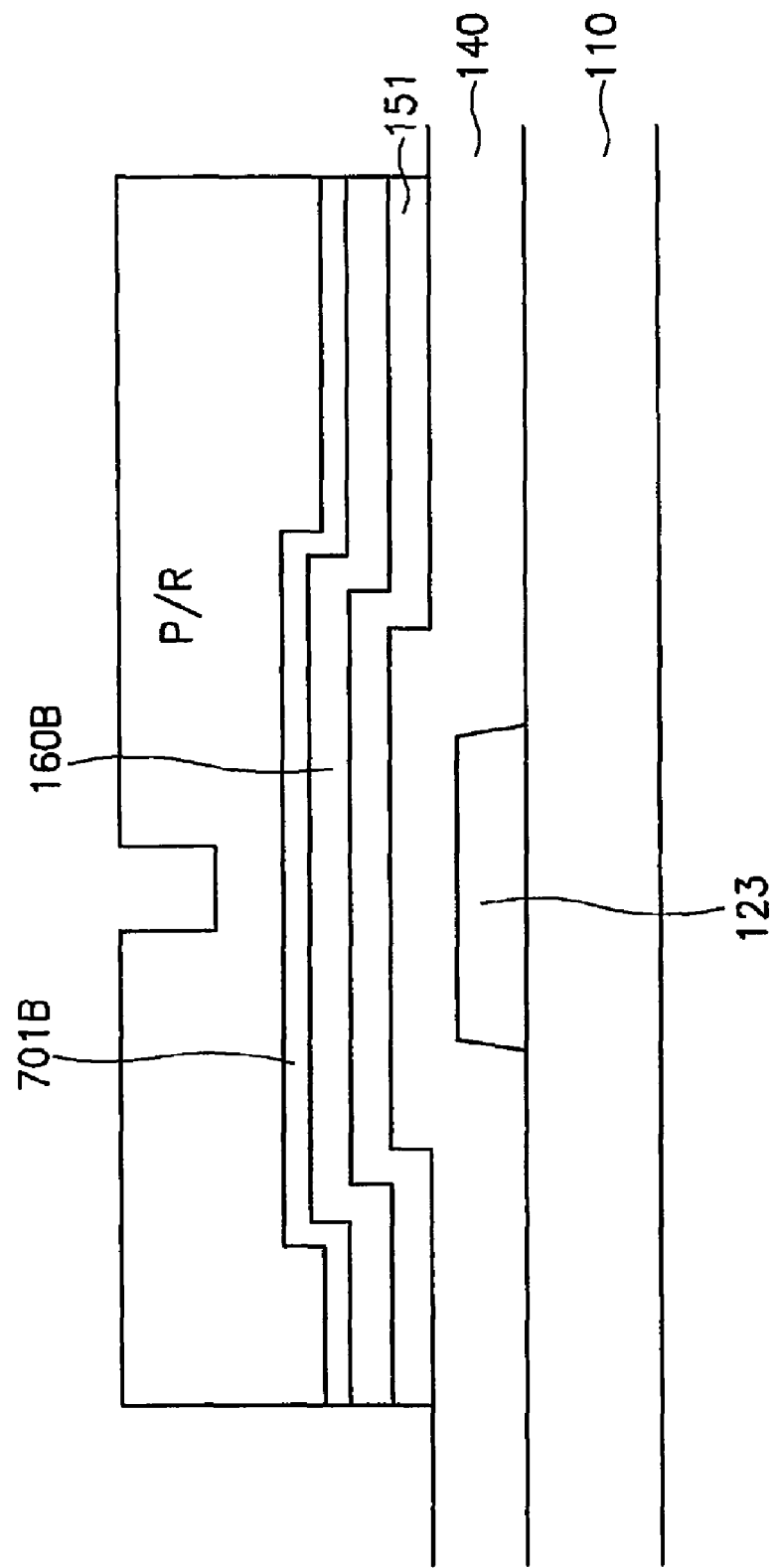

Referring to FIGS. 10A and 10B, the metal layer 701A, the extrinsic amorphous silicon layer 160A, the intrinsic amorphous silicon layer 150 are etched in sequence using the photoresist pattern P/R as a mask to form a data wire 701B, 171 and 179, an ohmic contact layer 160B, 161 and 162, and an amorphous silicon layer 151, 153 and 159. Since portions 701B of the data wire, which will be source and drain electrodes, and underlying portions 160B of the ohmic contact layer are not still disconnected, they have slight different shapes as those of a completed data wire and a completed ohmic contact layer, respectively.

To describe in detail, the etch using the photoresist pattern as a mask is performed in several steps.

First, portions the metal layer 701A on third areas C without the photoresist pattern are dry etched to expose portions of the extrinsic amorphous silicon layer 160A.

Portions of the extrinsic amorphous silicon layer 160A and the intrinsic amorphous silicon layer 150 on the third areas C as well as the first portions of the photoresist pattern on the first areas A are dry etched to complete the amorphous silicon layer 151, 153 and 159. At this time, the photo resist pattern is also etched to expose portions of the metal layer 701A on the first areas A.

Photoresist remnants on the first areas A are completely removed by ashing to expose portions of the metal layer 701A on the channel portions. At this time, the second portions of the photoresist pattern P/R are partly etched.

Figure 11A:
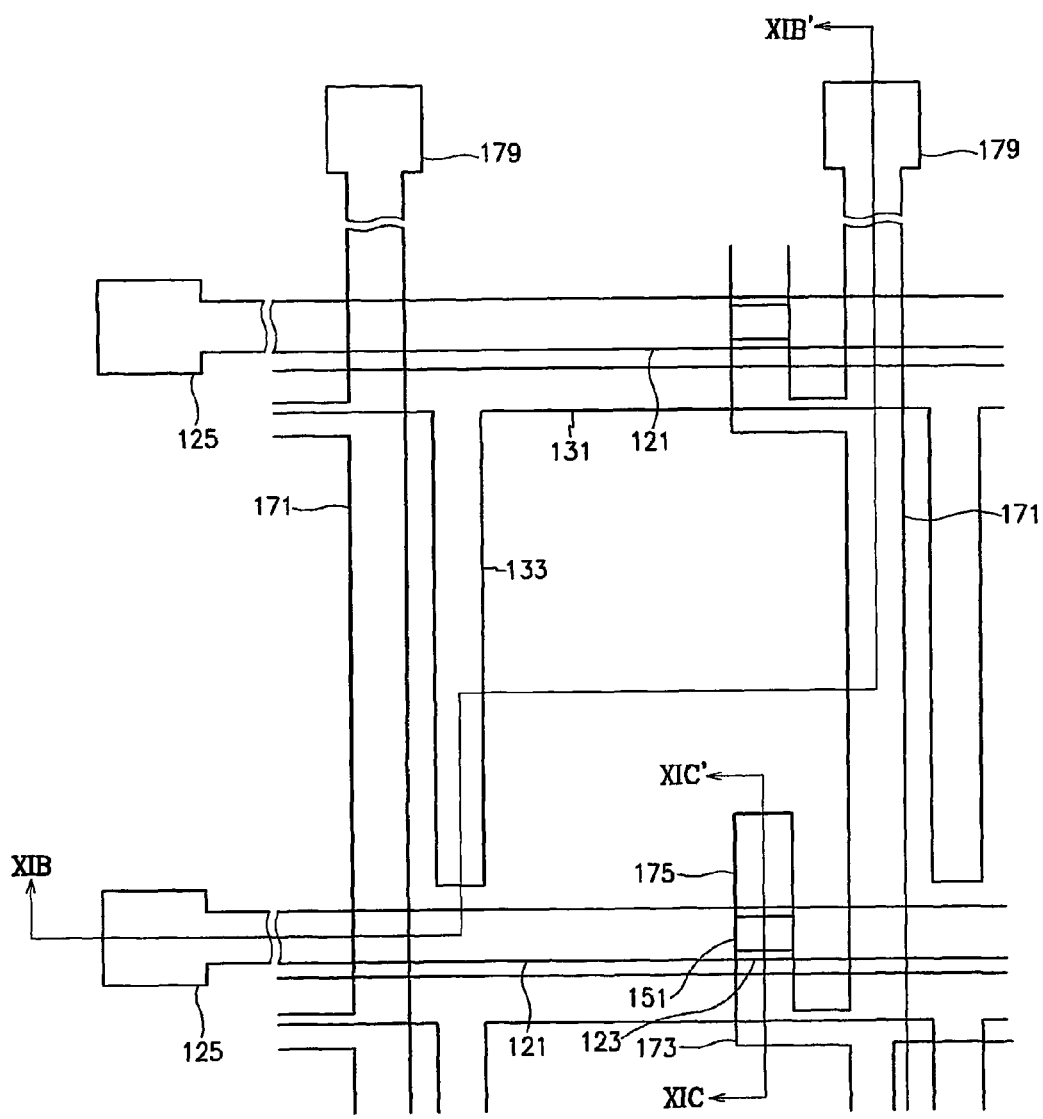
Figure 11B:
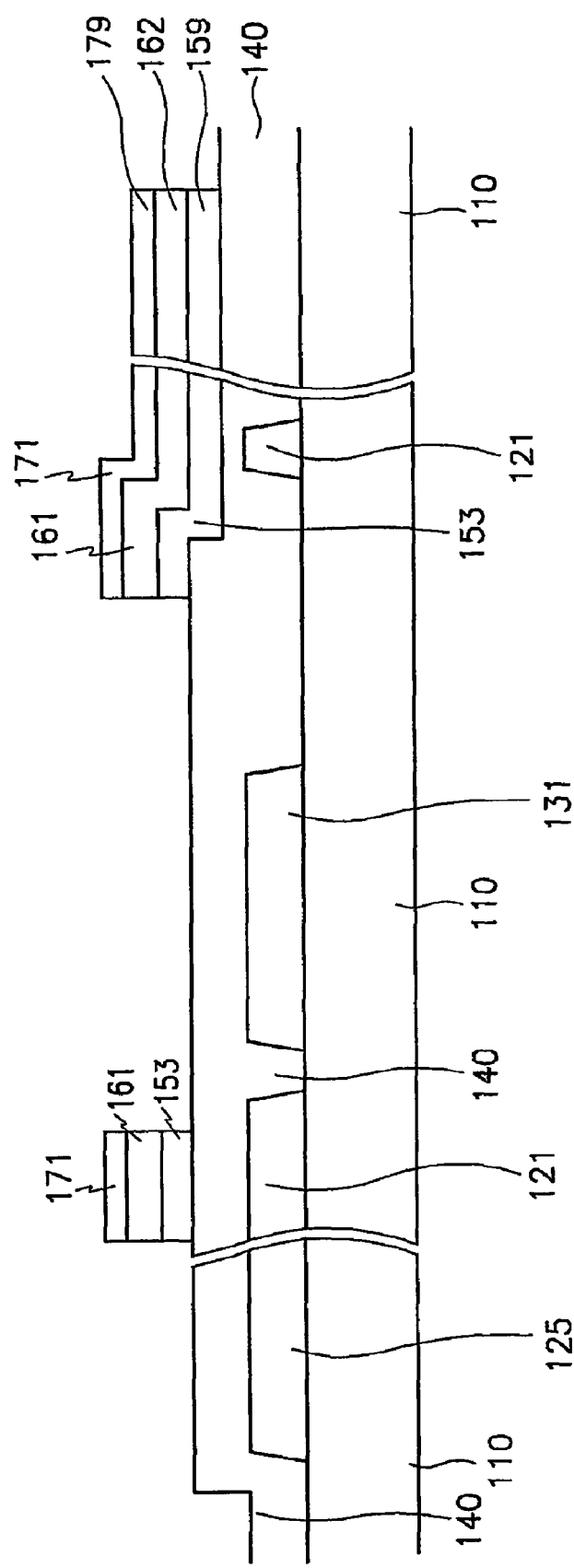
Figure 11C:
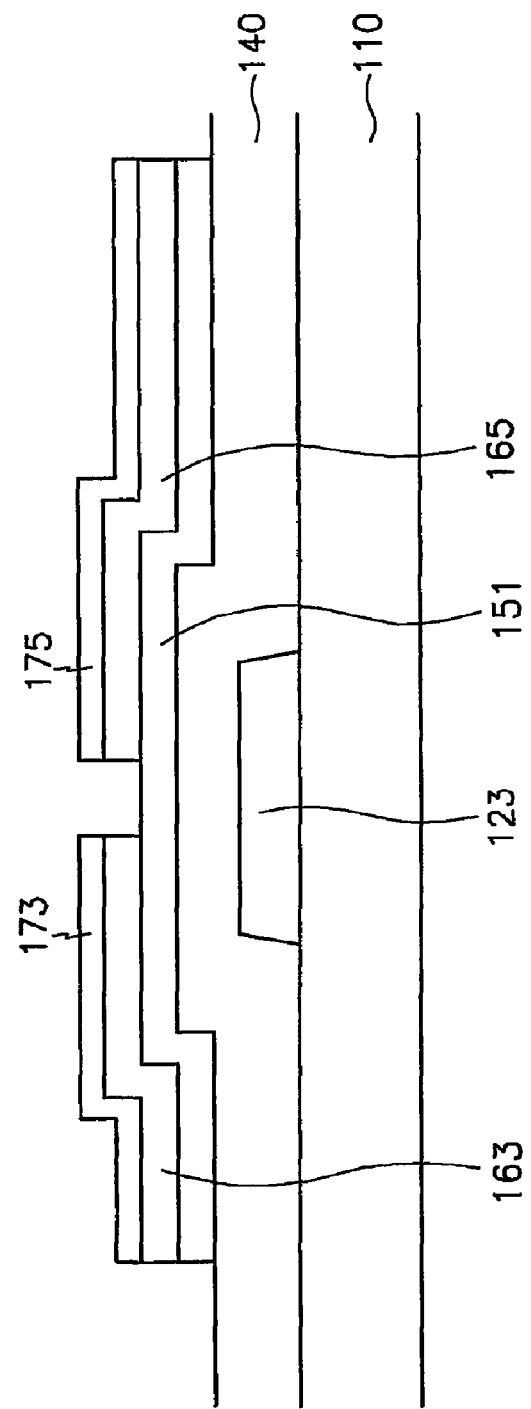

Referring to FIGS. 11A to 11C, portions 701B of the data wire and the extrinsic amorphous silicon layer 160B on the first areas A are etched to complete the data wire 171, 173, 175 and 179 and the ohmic contact layer 161, 162, 163 and 165. At this time, portions of the amorphous silicon layer 151 on the first areas A and portions of the photoresist pattern P/R on the second areas B may be partly etched.

Figure 12A:
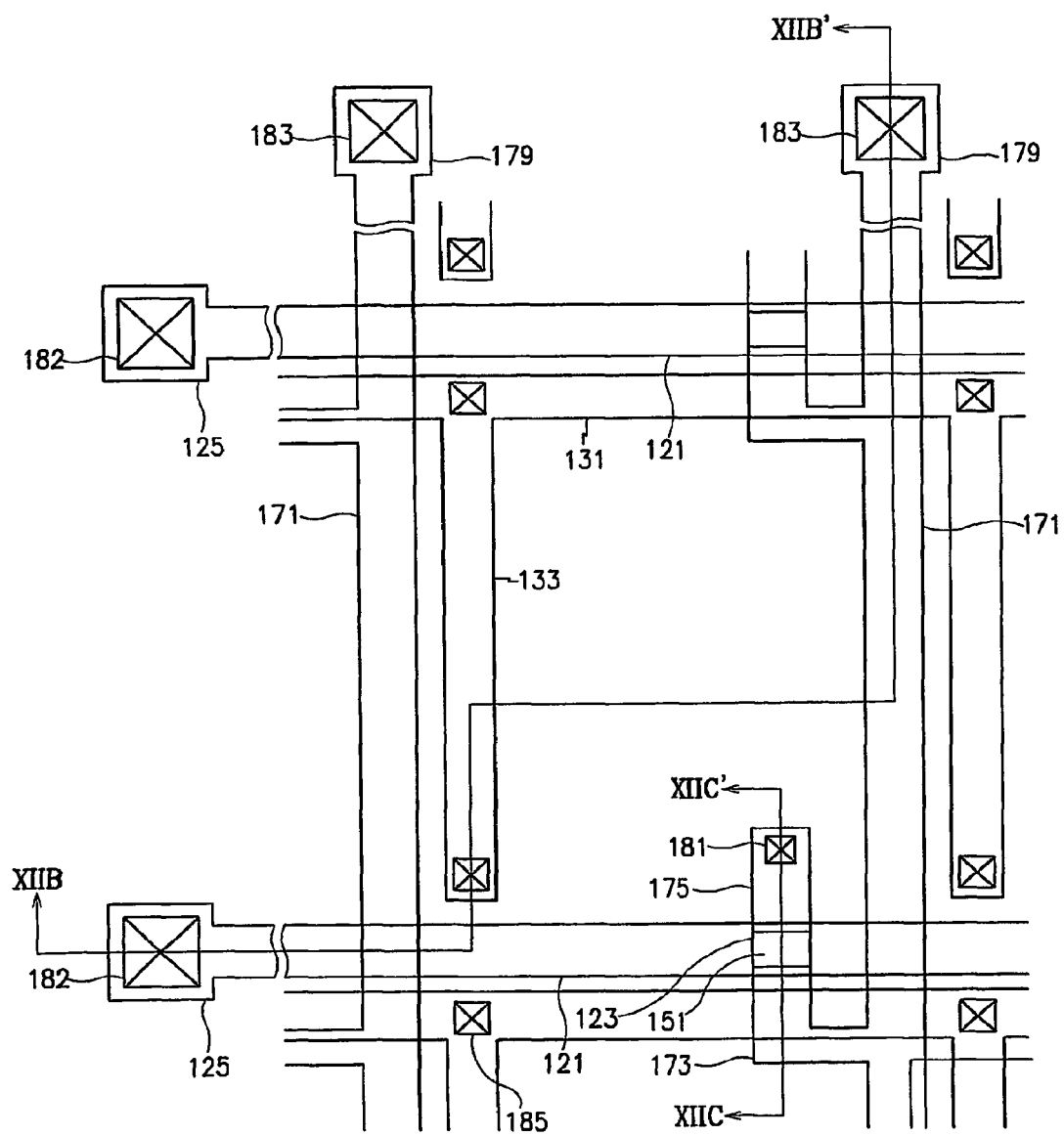
Figure 12C:
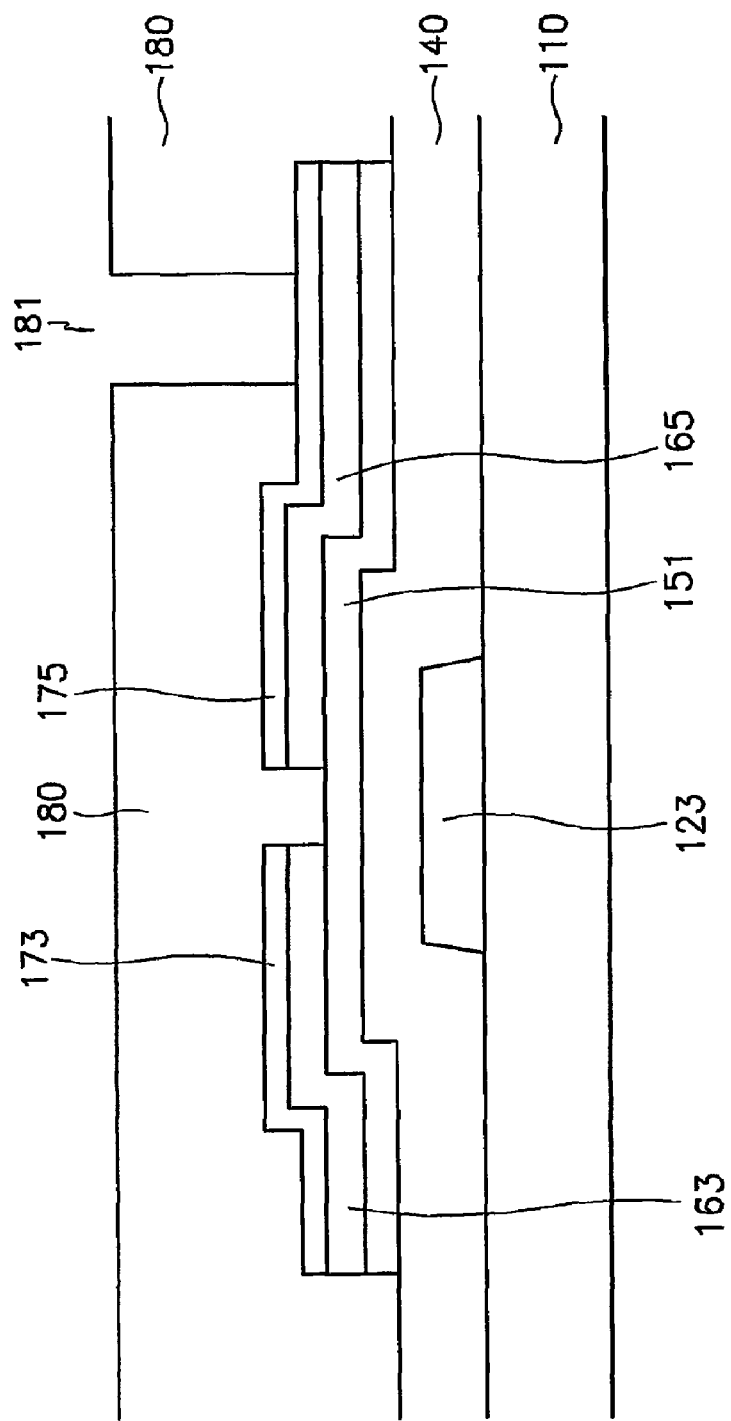

Referring to FIGS. 12A to 12C, a passivation layer 180 is deposited on the data wire 171, 173, 175 and 179 and photo-etched to form a plurality of first to fifth contact holes 181-185. (Third Mask)

Next, a conductive layer made of transparent conductive material such as ITO and IZO are formed on the passivation layer 180 having the first to the fifth contact holes 181-185 and patterned to form a plurality of pixel electrodes 190, a plurality of subsidiary gate pads 95, a plurality of subsidiary data pads 97, and a plurality of storage electrode connections 133. (Fourth Mask)

The pixel electrodes 190 are connected to the drain electrodes 175 through the first contact holes 181, the subsidiary gate pads 95 are connected to the gate pads 125 through the second contact holes 182, the subsidiary data pads 97 are connected to the data pads 179 through the third contact holes 183, and the storage electrode connections 91 are connected to the storage electrodes 133 and the storage electrode lines 131 through the fourth and the fifth contact holes 184 and 185, respectively.

Figure 13:
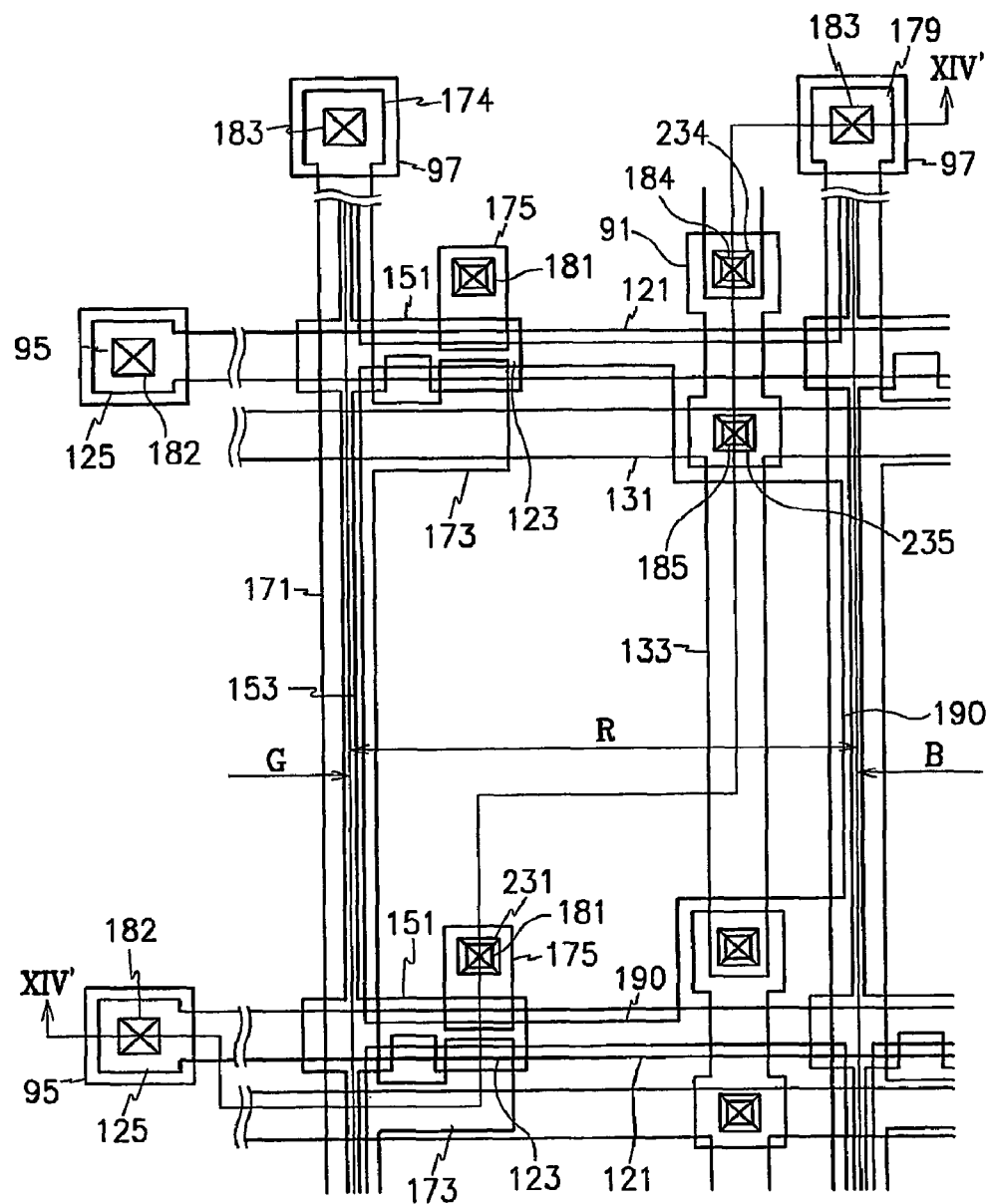
FIG. 13 is a layout view of a TFT array panel according to a fourth embodiment of the present invention.
Figure 14:
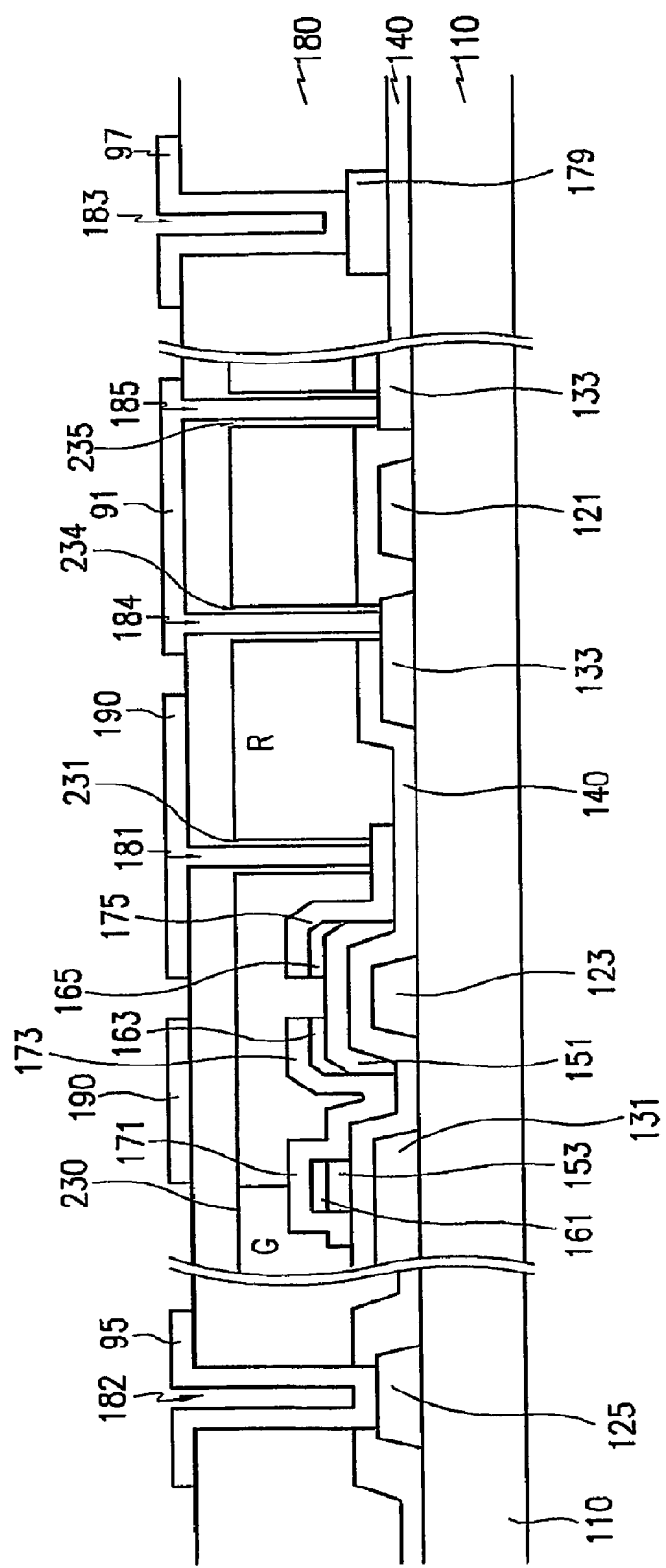
FIG. 14 is a section view of the TFT array panel shown in FIG. 13 taken along the line XIV-XIV'.

FIG. 13 is a layout view of a TFT array panel according to a fourth embodiment of the present invention, and FIG. 14 is a section view of the TFT array panel shown in FIG. 13 taken along the line XIV-XIV'.

A gate wire 121, 123 and 125, a storage electrode wire 131 and 133, a gate insulating layer 140, an amorphous silicon layer 151 and 153, an ohmic contact layer 161, 163 and 165, and a data wire 171, 173, 175 and 179 of a TFT array panel according to a fourth embodiment of the present invention are substantially the same as those of the TFT array panel according to the second embodiment of the present invention.

A plurality of red, green and blue color filters 230 are formed by pixel columns on the data wire 171, 173, 175 and 179, and a passivation layer 180 is formed on the color filters 230. The color filters 230 have first to third contact holes 231, 234 and 235 exposing the drain electrodes 175, the storage electrodes 133, and the storage electrode lines 131, respectively, and the passivation layer 180 has first to fifth contact holes 181-185 exposing the drain electrodes 175, the gate pads 125, the data pads 179, the storage electrodes 133, and the storage electrode lines 131, respectively. A plurality of pixel electrodes 190, a plurality of subsidiary gate pads 95, a plurality of subsidiary data pads 97, and a plurality of storage electrode connections 91 are formed on the passivation layer 180. The pixel electrodes 190 are connected to the drain electrodes 175 through the contact holes 231 and 181 in the color filters 230 and the passivation layer 180, the subsidiary gate pads 95 are connected to the gate pads 125 through the contact holes 182 in the passivation layer 180, and the subsidiary data pads 97 are connected to the data pads 179 through the contact holes 183 in the passivation layer 180. The storage electrode connections 91 are connected to the storage electrodes 133 through the contact holes 234 and 184 in the color filters 230 and the passivation layer 180, and to the storage electrode lines 131 through the contact holes 235 and 185.

The storage electrode connections 91 connects the storage electrodes 133 to the storage electrode lines 131 opposite the gate lines 121 across the gate lines 121. Accordingly, all the storage electrode wire 131 and 133 on the substrate 110 are connected to each other via connection paths provided at all the pixel areas. In this way, the storage electrode wire 131 and 133 are connected via several paths such that its resistance is kept to be low at any point in the substrate 110.

Figure 15:
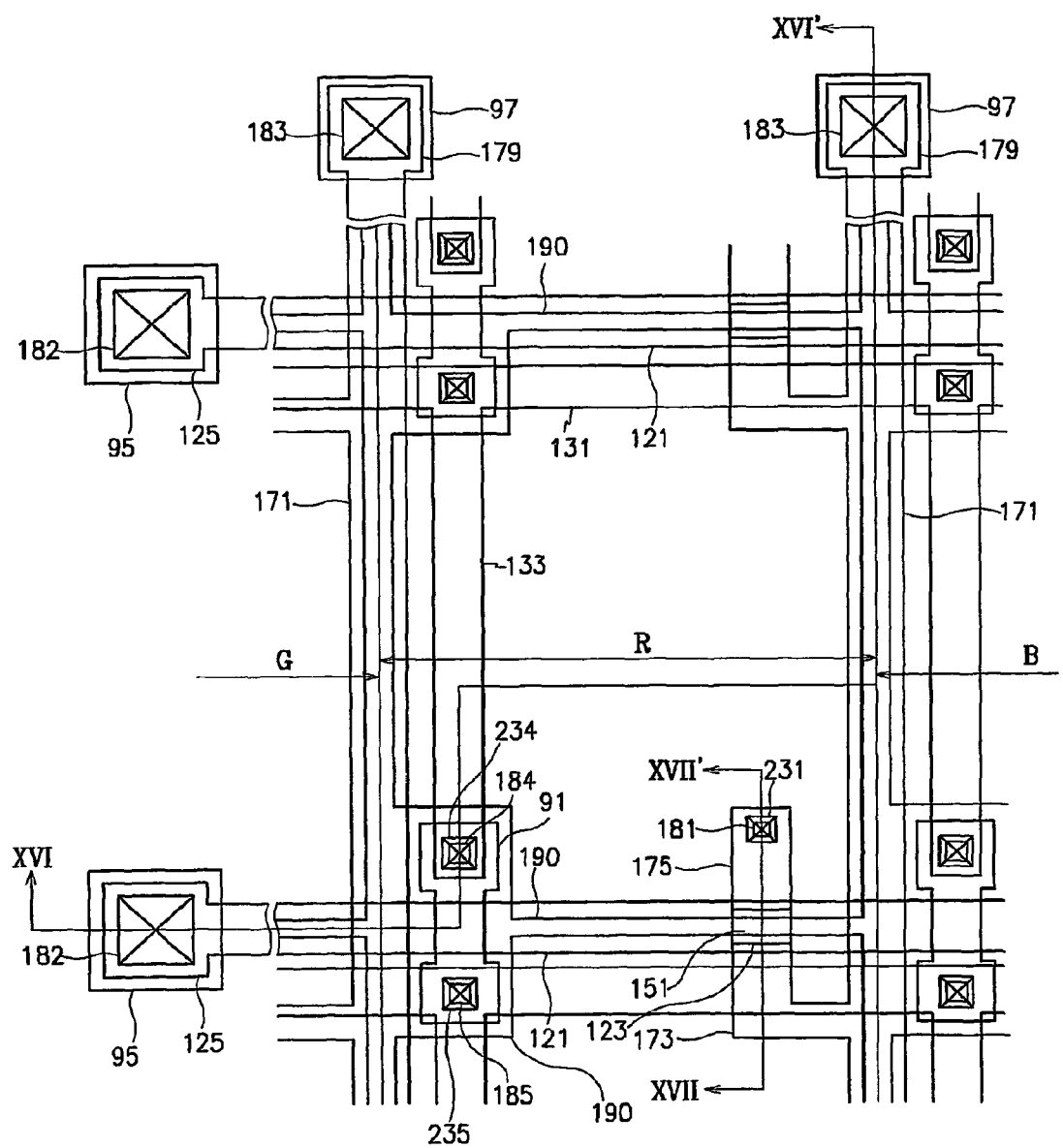
FIG. 15 is a layout view of a TFT array panel according to a fifth embodiment of the present invention.
Figure 16:
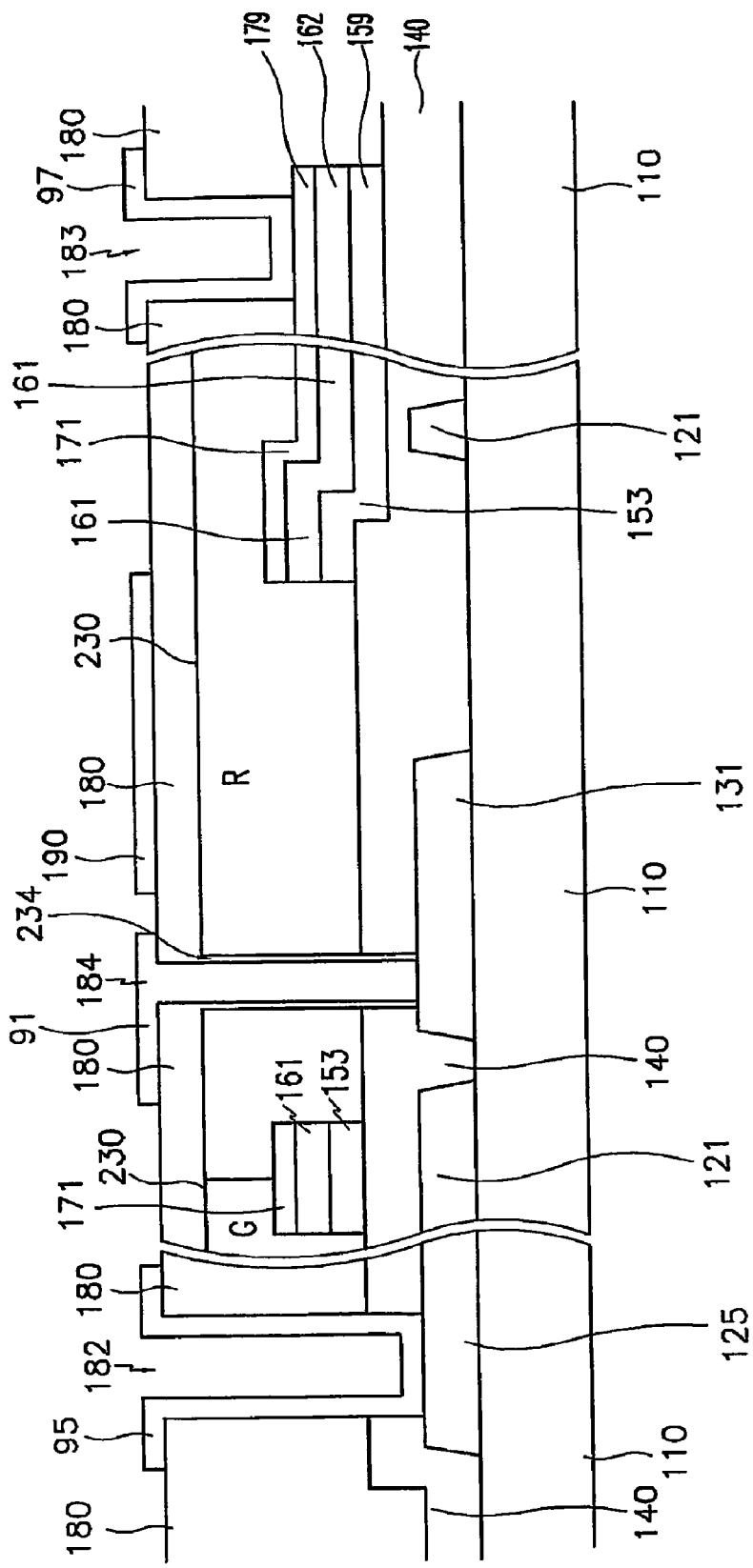
FIG. 16 is a sectional view of the TFT array panel shown in FIG. 15 taken along the line XVI-XVI'.
Figure 17:
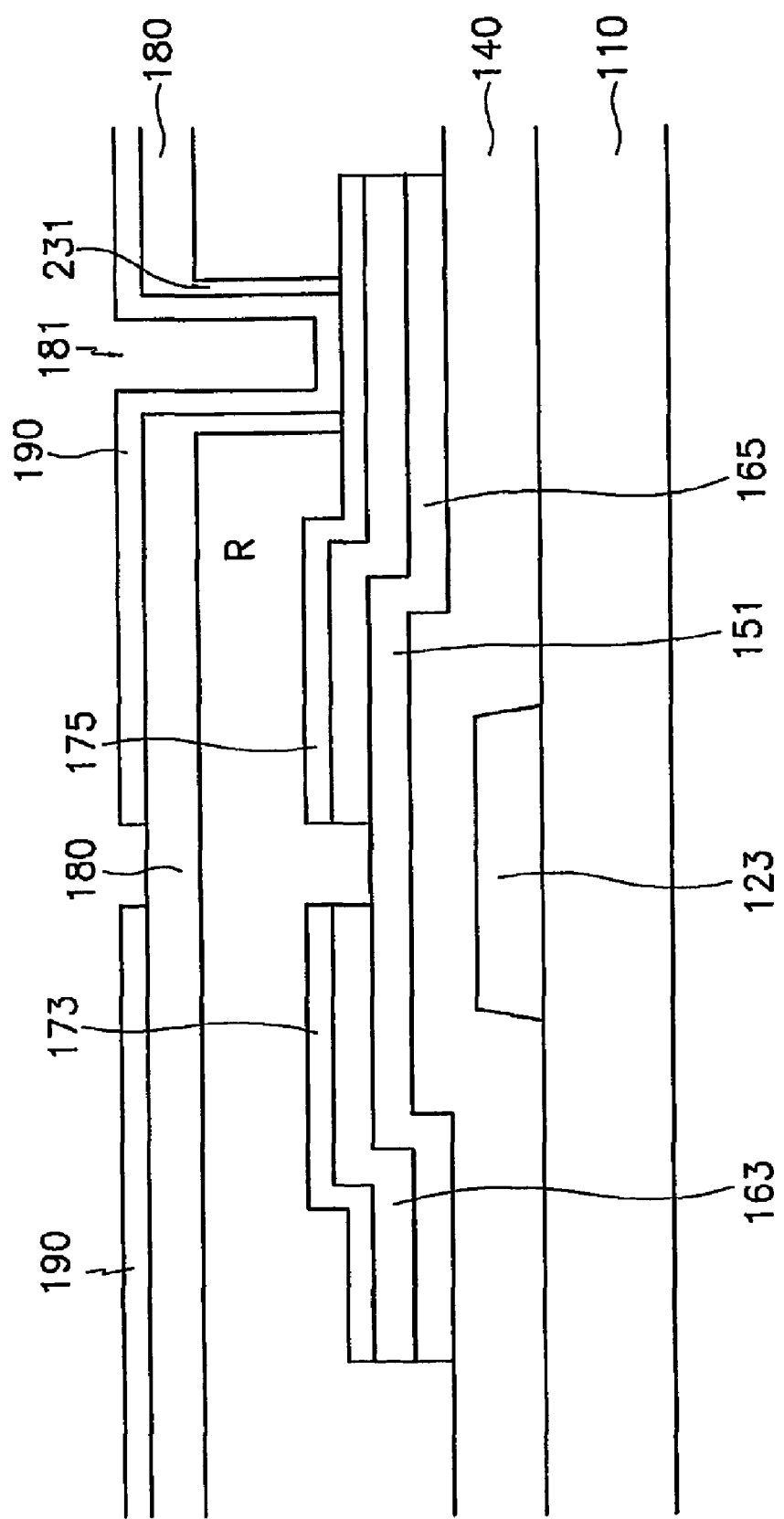
FIG. 17 is a sectional view of the TFT array panel shown in FIG. 15 taken along the line XVII-XVII'.

FIG. 15 is a layout view of a TFT array panel according to a fifth embodiment of the present invention, FIG. 16 is a sectional view of the TFT array panel shown in FIG. 15 taken along the line XVI-XVI', and FIG. 17 is a sectional view of the TFT array panel shown in FIG. 15 taken along the line XVII-XVII'.

A gate wire 121, 123 and 125, a storage electrode wire 131 and 133, a gate insulating layer 140, an amorphous silicon layer 151, 153 and 159, an ohmic contact layer 161, 162, 163 and 165, and a data wire 171, 173, 175 and 179 of a TFT array panel according to a fifth embodiment of the present invention are substantially the same as those of the TFT array panel according to the third embodiment of the present invention.

A plurality of red, green and blue color filters 230 are formed by pixel columns on the data wire 171, 173, 175 and 179. The color filters 230 are disposed on a display area including a plurality of pixel areas arranged in a matrix, but they are not disposed on a peripheral area provided with pads 125 and 179. A passivation layer 180 is formed on the color filters 230. The color filters 230 have first to third contact holes 231, 234 and 235 exposing the drain electrodes 175, the storage electrodes 133, and the storage electrode lines 131, respectively, and the passivation layer 180 has first to fifth contact holes 181-185 exposing the drain electrodes 175, the gate pads 125, the data pads 179, the storage electrodes 133, and the storage electrode lines 131, respectively. A plurality of pixel electrodes 190, a plurality of subsidiary gate pads 95, a plurality of subsidiary data pads 97, and a plurality of storage electrode connections 91 are formed on the passivation layer 180. The pixel electrodes 190 are connected to the drain electrodes 175 through the contact holes 231 and 181 in the color filters 230 and the passivation layer 180, the subsidiary gate pads 95 are connected to the gate pads 125 through the contact holes 182 in the passivation layer 180, and the subsidiary data pads 97 are connected to the data pads 179 through the contact holes 183 in the passivation layer 180. The storage electrode connections 91 are connected to the storage electrodes 133 through the contact holes 234 and 184 in the color filters 230 and the passivation layer 180, and to the storage electrode lines 131 through the contact holes 235 and 185.

The storage electrode connections 91 connects the storage electrodes 133 to the storage electrode lines 131 opposite the gate lines 121 across the gate lines 121. Accordingly, all the storage electrode wire 131 and 133 on the substrate 110 are connected to each other via connection paths provided at all the pixel areas. In this way, the storage electrode wire 131 and 133 are connected via several paths such that its resistance is kept to be low at any point in the substrate 110.

A manufacturing method of the TFT array panel having an above-described configuration is substantially the same as that according to the third embodiment except that it includes an additional step of forming the color filters 230 by coating, light-exposing, and developing photosensitive material containing pigments for respective color before forming the passivation layer 180.

As described above, the storage electrode wire 131 and 133 are connected to each other using the storage electrode connections 91 in respective pixel areas, thereby omitting a common bar. Following embodiments do not omit a common bar and reduce areas occupied by the common bar for securing fan-out areas.

Figure 18:
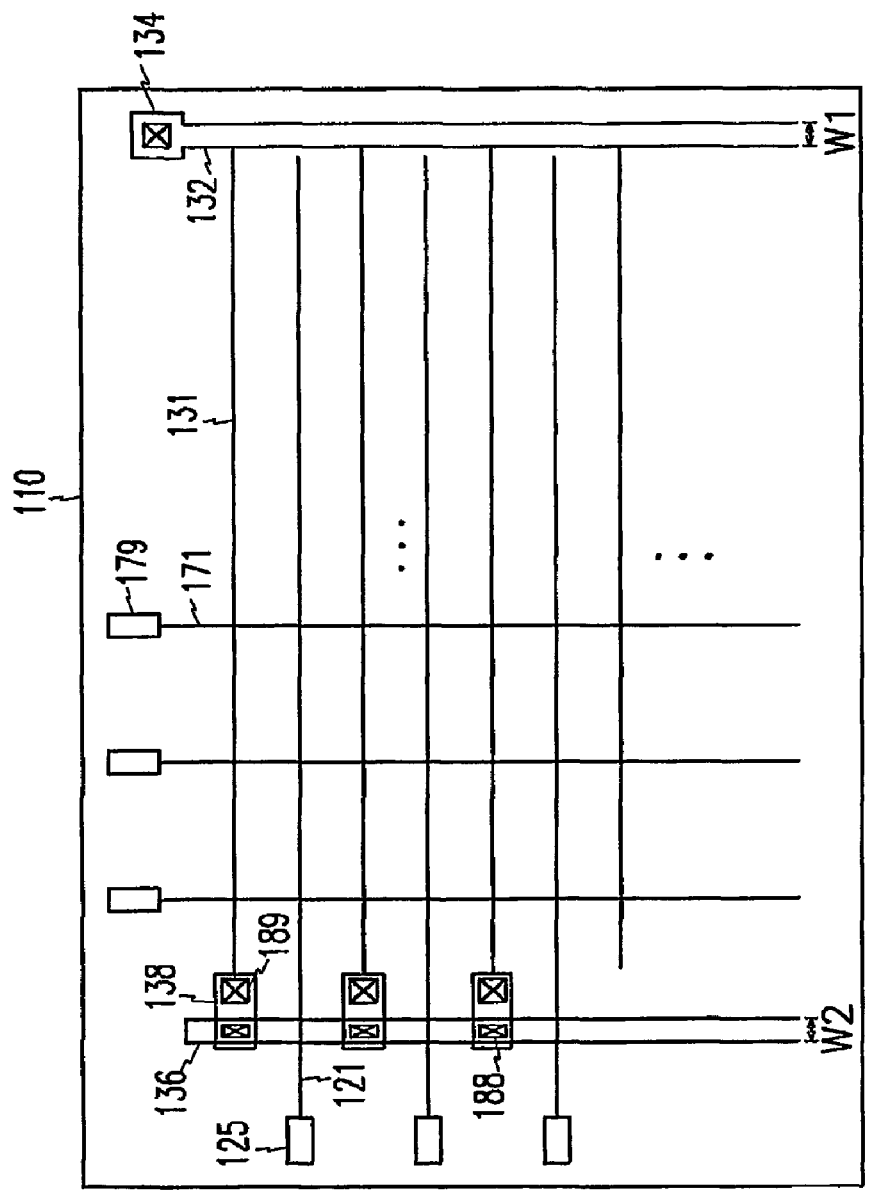
FIG. 18 is a schematic diagram of a TFT array panel according to a sixth embodiment of the present invention.

FIG. 18 is a schematic diagram of a TFT array panel according to a sixth embodiment of the present invention.

A plurality of gate lines 121 extending in a transverse direction and a plurality of data lines 171 insulated from and crossing over the gate lines 121 and extending in a longitudinal direction are formed on an insulating substrate 110. A plurality of gate pads 125 and a plurality of data pads 179 are provided at right ends of the gate lines 121 and upper ends of the data lines 171, respectively. A plurality of pad areas (not shown) are provided between the gate pads 125 and a display area (where the gate lines 121 and the data lines 171 intersect). A storage electrode line 131 extending in the transverse direction is formed between every adjacent two of the gate lines 121, and the storage electrode lines 131 on the substrate 110 are connected to each other through a first common bar 132 located near a right edge of the substrate 110 and a second common bar 136 located near a left edge of the substrate 110. The second the common bar 136 is formed of the same layer as the data lines 171 and connected to the storage electrode lines 131 formed of the same layer as the gate lines 121 through a plurality of connecting pieces formed of the same layer as pixel electrodes (not shown). For this connection, a gate insulating layer and a passivation layer have a plurality of contact holes 188 and 189. The first the common bar 132 includes a pad 134 at its one end.

The width W2 of the second the common bar 136 is smaller than the width W1 of the first the common bar 132, and has a value equal to or less than 150 microns, thereby securing a sufficiently large sized of the fan-out areas.

While the present invention has been described in detail with reference to the preferred embodiments, those skilled in the art will appreciate that various modifications and substitutions can be made thereto without departing from the spirit and scope of the present invention as set forth in the appended claims.

As described above, the storage electrode wire is connected by connecting paths in the pixel areas such that a common bar located between the gate pads and the display area is omitted or is narrowed. In this way, a sufficiently large size of the fan-out areas is obtained to reduce the resistance difference between the signal lines.

What is claimed is:

1. A thin film transistor array panel comprising:
    an insulating substrate;
    an active area displaying images, and comprising a pixel electrode electrically connected to a thin film transistor;
    a peripheral area surrounding the active area, and comprising a first portion and a second portion being opposite to the first portion with the active area therebetween;
    a storage electrode line insulated from the thin film transistor, and at least partially overlapping the pixel electrode;
    a first common bar having a first width, disposed on the first portion, and electrically connected to one side of the storage electrode line; and
    a second common bar having a second width different from the first width, disposed on the second portion, and electrically connected to another side of the storage electrode line.

2. The thin film transistor array panel of claim 1, further comprising:
    a gate line electrically connected to the thin film transistor, and
    a first pad disposed on the first porion, and electrically connected to the gate line,
    wherein the first common bar is disposed between the gate pad and the pixel area, and the first width is smaller than the second width.

3. The thin film transistor array panel of claim 2, further comprising a fan-out portion between the first pad and the first common bar.

4. The thin film transistor array panel of claim 3, further comprising a storage pad electrically connected to the second common bar.

5. The thin film transistor array panel of claim 4, wherein the first common bar is disposed on a different layer than the storage electrode line.

6. The thin film transistor array panel of claim 1, further comprising a storage pad electrically connected to the second common bar.

7. The thin film transistor array panel of claim 6, further comprising:
    a gate line electrically connected to the thin film transistor, and
    a first pad disposed on the first porion, and electrically connected to the gate line,
    wherein the first common bar is disposed between the gate pad and the pixel area, and the first width is smaller than the second width.

8. The thin film transistor array panel of claim 7, wherein the first common bar is disposed on a different layer than the storage electrode line.

9. The thin film transistor array panel of claim 6 wherein the first common bar is disposed on a different layer than the storage electrode line.

10. The thin film transistor array panel of claim 1, wherein the first common bar is disposed on a different layer than the storage electrode line.

11. The thin film transistor array panel of claim 10, further comprising:
    a gate line electrically connected to the thin film transistor, and
    a first pad disposed on the first porion, and electrically connected to the gate line,
    wherein the first common bar is disposed between the gate pad and the pixel area, and the first width is smaller than the second width.

12. The thin film transistor array panel of claim 11, further comprising a fan-out portion between the first pad and the first common bar.

* * * * *